(12) United States Patent
Rengarajan et al.

(10) Patent No.: US 10,405,448 B2
(45) Date of Patent: Sep. 3, 2019

(54) HIGH FREQUENCY BGA CONNECTOR

(71) Applicant: FCI USA LLC, Etters, PA (US)

(72) Inventors: Madhumitha Rengarajan, Mechanicsburg, PA (US); Lewis Robin Johnson, York, PA (US)

(73) Assignee: FCI USA LLC, Etters, PA (US)

( * ) Notice: Subject to any disclaimer, the term of this patent is extended or adjusted under 35 U.S.C. 154(b) by 0 days.

(21) Appl. No.: 15/964,246

(22) Filed: Apr. 27, 2018

(65) Prior Publication Data

US 2018/0317335 A1 Nov. 1, 2018

Related U.S. Application Data

(60) Provisional application No. 62/491,996, filed on Apr. 28, 2017.

(51) Int. Cl.
*H01R 12/71* (2011.01)
*H05K 7/10* (2006.01)
(Continued)

(52) U.S. Cl.
CPC ..... *H05K 7/1053* (2013.01); *H01L 23/49816* (2013.01); *H01R 13/514* (2013.01);
(Continued)

(58) Field of Classification Search
None
See application file for complete search history.

(56) References Cited

U.S. PATENT DOCUMENTS 3,259,869 A 7/1966 Batcheller
3,411,127 A 11/1968 Adams
(Continued)

FOREIGN PATENT DOCUMENTS

CN 101006614 A 7/2007
CN 203277706 U 11/2013
(Continued)

OTHER PUBLICATIONS

International Search Report and Written Opinion for International Application No. PCT/US2018/029706 dated Aug. 10, 2018.
(Continued)

*Primary Examiner* — Xuong M Chung Trans
(74) *Attorney, Agent, or Firm* — Wolf, Greenfield & Sacks, P.C.

(57) ABSTRACT

A connector for surface mounting with a solder reflow process with closely-spaced solder masses on mounting ends of reference contacts. The solder masses on the reference contacts may fuse for enhanced shielding. The mounting ends of signal and reference contacts may be positioned in rows, configured such that the solder masses of the reference contacts may shield solder masses attached to signal contacts in adjacent rows. The mounting ends of the signal contacts may be disposed in pockets in a surface of the connector housing. In some embodiments, solder balls may be fused to an edge of the signal contact, with the length of the edge extending beyond locations at which the solder ball is fused to. The edge may extend through a wall of the pocket, so as to set a desired impedance in the mounting region of the connector.

25 Claims, 20 Drawing Sheets

(51) Int. Cl.
*H01R 13/514* (2006.01)
*H01L 23/498* (2006.01)
*H01R 43/02* (2006.01)
*H01R 13/6471* (2011.01)
*H01R 12/57* (2011.01)
*H01R 12/73* (2011.01)

(52) U.S. Cl.
CPC ..... *H01R 13/6471* (2013.01); *H01R 43/0256* (2013.01); *H01R 12/57* (2013.01); *H01R 12/716* (2013.01); *H01R 12/737* (2013.01)

(56) References Cited

U.S. PATENT DOCUMENTS

| | | | |
|---|---|---|---|
| 3,865,462 A | 2/1975 | Cobaugh et al. | |
| 4,241,970 A | 12/1980 | Rider, Jr. et al. | |
| 4,740,180 A | 4/1988 | Harwath et al. | |
| 5,267,881 A | 12/1993 | Matuzaki | |
| 5,290,181 A | 3/1994 | Bixler et al. | |
| 5,558,542 A | 9/1996 | O'Sullivan et al. | |
| 5,692,928 A | 12/1997 | Nelson et al. | |
| 5,795,191 A | 8/1998 | Preputnick et al. | |
| 5,957,734 A | 9/1999 | Gladd et al. | |
| 5,980,337 A | 11/1999 | Little | |
| 6,024,584 A | 2/2000 | Lemke et al. | |
| 6,042,389 A | 3/2000 | Lemke et al. | |
| 6,079,991 A | 6/2000 | Lemke et al. | |
| 6,093,035 A | 7/2000 | Lemke et al. | |
| 6,139,336 A | 10/2000 | Olson | |
| 6,146,202 A | 11/2000 | Ramey et al. | |
| 6,164,983 A | 12/2000 | Lemke et al. | |
| 6,183,268 B1 | 2/2001 | Consoli et al. | |
| 6,193,537 B1 | 2/2001 | Harper, Jr. et al. | |
| 6,247,635 B1 | 6/2001 | Olson | |
| 6,325,644 B1 | 12/2001 | Lemke et al. | |
| 6,358,068 B1 | 3/2002 | Houtz | |
| 6,371,784 B1 | 4/2002 | Scholz et al. | |
| 6,425,785 B1 | 7/2002 | Azuma | |
| 6,454,157 B2 | 9/2002 | Olson | |
| 6,488,550 B1 | 12/2002 | Kikuchi et al. | |
| 6,565,368 B1 | 5/2003 | Liao et al. | |
| 6,623,284 B1 | 9/2003 | Korsunsky | |
| 6,699,048 B2 | 3/2004 | Johnson et al. | |
| 6,848,944 B2* | 2/2005 | Evans | H01R 12/728 439/607.1 |
| 6,860,741 B2 | 3/2005 | Ashmann et al. | |
| 6,869,292 B2* | 3/2005 | Johnescu | H01R 13/506 439/74 |
| 6,872,085 B1* | 3/2005 | Cohen | H01R 13/6585 439/108 |
| 6,899,547 B1 | 5/2005 | Chang et al. | |
| 6,939,173 B1 | 9/2005 | Elco et al. | |
| 7,059,873 B2 | 6/2006 | Johnescu et al. | |
| 7,097,465 B1 | 8/2006 | Korsunsky et al. | |
| 7,214,104 B2 | 5/2007 | Minich et al. | |
| 7,322,855 B2 | 1/2008 | Mongold et al. | |
| 7,341,482 B2 | 3/2008 | Ngo | |
| 7,371,094 B1 | 5/2008 | Tokuhashi et al. | |
| 7,431,616 B2 | 10/2008 | Minich | |
| D585,031 S | 1/2009 | Hung | |
| 7,503,773 B2 | 3/2009 | Tokunaga | |
| 7,585,185 B2 | 9/2009 | Obikane | |
| 7,597,581 B2 | 10/2009 | Trout et al. | |
| 7,632,107 B2 | 12/2009 | Mizumura | |
| 7,766,670 B1 | 8/2010 | Ju | |
| 7,985,079 B1 | 7/2011 | Wilson et al. | |
| 8,257,095 B2 | 9/2012 | Akai et al. | |
| 9,257,778 B2 | 2/2016 | Buck et al. | |
| 9,520,661 B1* | 12/2016 | Horning | H01R 12/716 |
| 9,543,703 B2* | 1/2017 | Horchler | H01R 13/64 |
| 9,735,484 B2 | 8/2017 | Brubaker et al. | |
| 9,735,848 B2 | 8/2017 | Saiwai et al. | |
| 9,831,605 B2 | 11/2017 | Buck et al. | |
| 9,871,323 B2 | 1/2018 | Horchler et al. | |
| 2002/0061687 A1 | 5/2002 | Cachina et al. | |
| 2002/0098738 A1 | 7/2002 | Astbury, Jr. et al. | |
| 2004/0175995 A1 | 9/2004 | Tsai | |
| 2005/0020103 A1 | 1/2005 | Spink | |
| 2005/0142908 A1 | 6/2005 | Harper, Jr. | |
| 2007/0021002 A1 | 1/2007 | Laurx et al. | |
| 2007/0155241 A1 | 7/2007 | Lappohn | |
| 2007/0175572 A1 | 8/2007 | Rubin et al. | |
| 2007/0224845 A1 | 9/2007 | Becker et al. | |
| 2008/0176418 A1 | 7/2008 | Hougham et al. | |
| 2008/0207023 A1 | 8/2008 | Tuin et al. | |
| 2008/0311768 A1 | 12/2008 | Hougham et al. | |
| 2009/0023311 A1 | 1/2009 | Goodman | |
| 2009/0264023 A1 | 10/2009 | Yi et al. | |
| 2010/0015861 A1 | 1/2010 | Zhang et al. | |
| 2010/0055988 A1 | 3/2010 | Shuey et al. | |
| 2010/0093232 A1 | 4/2010 | Trout et al. | |
| 2010/0240233 A1 | 9/2010 | Johnescu et al. | |
| 2010/0291803 A1 | 11/2010 | Kirk | |
| 2011/0097934 A1 | 4/2011 | Minich | |
| 2011/0117781 A1 | 5/2011 | Stoner | |
| 2012/0077380 A1 | 3/2012 | Minich et al. | |
| 2012/0088378 A1 | 4/2012 | Rathburn | |
| 2012/0202363 A1 | 8/2012 | McNamara et al. | |
| 2013/0273781 A1 | 10/2013 | Buck et al. | |
| 2014/0017957 A1 | 1/2014 | Horchler et al. | |
| 2014/0148022 A1 | 5/2014 | Mongold et al. | |
| 2014/0273553 A1 | 9/2014 | Heppner et al. | |
| 2016/0134057 A1 | 5/2016 | Buck et al. | |
| 2017/0125946 A1 | 5/2017 | Horchler et al. | |
| 2017/0317440 A1 | 11/2017 | Lauermann | |
| 2018/0241156 A1 | 8/2018 | Huang et al. | |
| 2018/0316106 A1 | 11/2018 | Rengarajan et al. | |

FOREIGN PATENT DOCUMENTS

| | | |
|---|---|---|
| JP | 2009-129708 A | 6/2009 |
| KR | 10-2009-0029286 A | 3/2009 |
| TW | 201136063 A | 10/2011 |
| WO | WO 02/101882 A2 | 12/2002 |
| WO | WO 2006/105484 A1 | 10/2006 |
| WO | WO 2008/156851 A2 | 12/2008 |
| WO | WO 2016/064804 A1 | 4/2016 |

OTHER PUBLICATIONS

[No Author Listed], NeXLev. High-Density Parallel Board Connector. Amphenol TCS. 2009. 2 pages.
[No Author Listed], Gig-Array Connector System. Board/Wire-To-Board Connectors. FCI. Estimated date of publication before 2016. 5 pages.
European Examination for European Application No. EP 13775244.0 dated Feb. 28, 2019.
International Search Report and Written Opinion for International Application No. PCT/US2015/056346 dated Jan. 28, 2016.
International Preliminary Report on Patentability for International Application No. PCT/US2015/056346 dated May 4, 2017.
International Search Report and Written Opinion for International Application No. PCT/US2018/029709 dated Aug. 16, 2018.

* cited by examiner

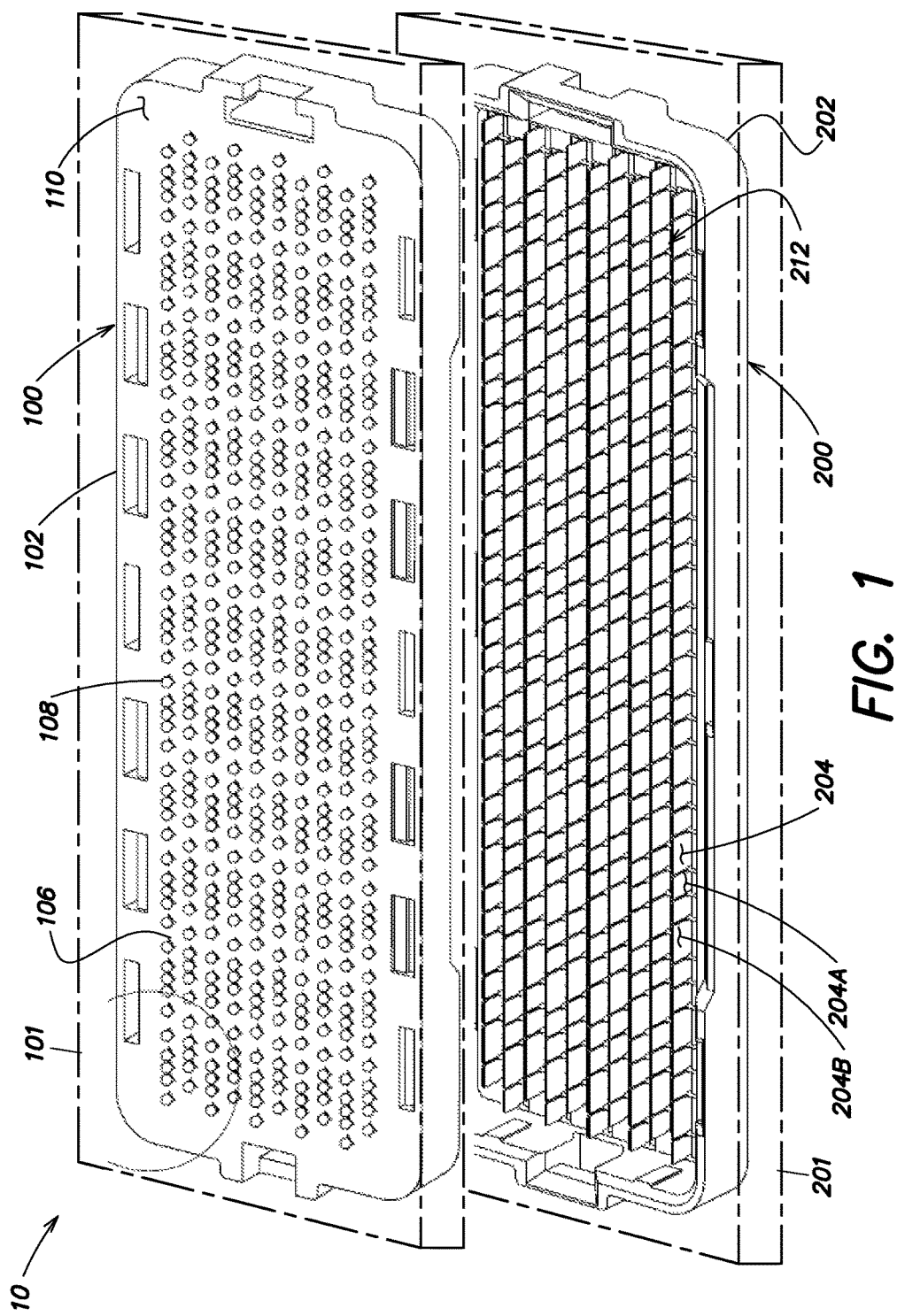

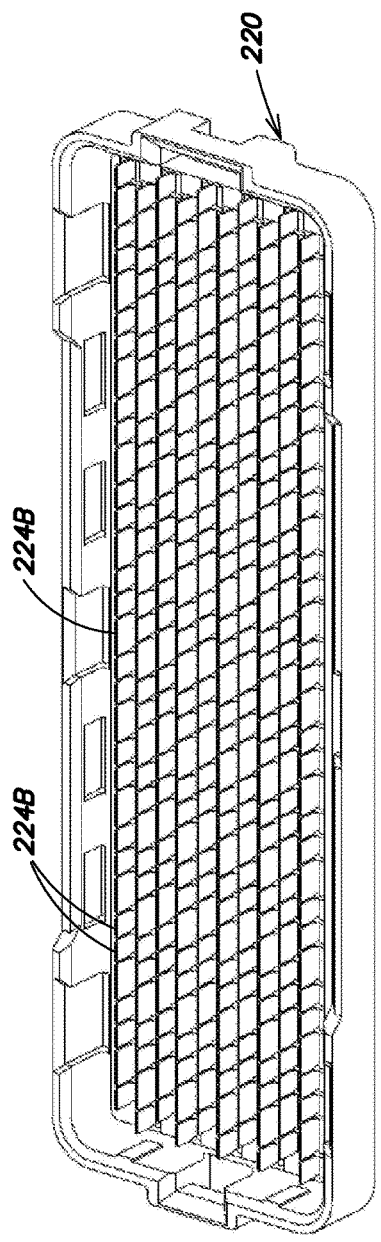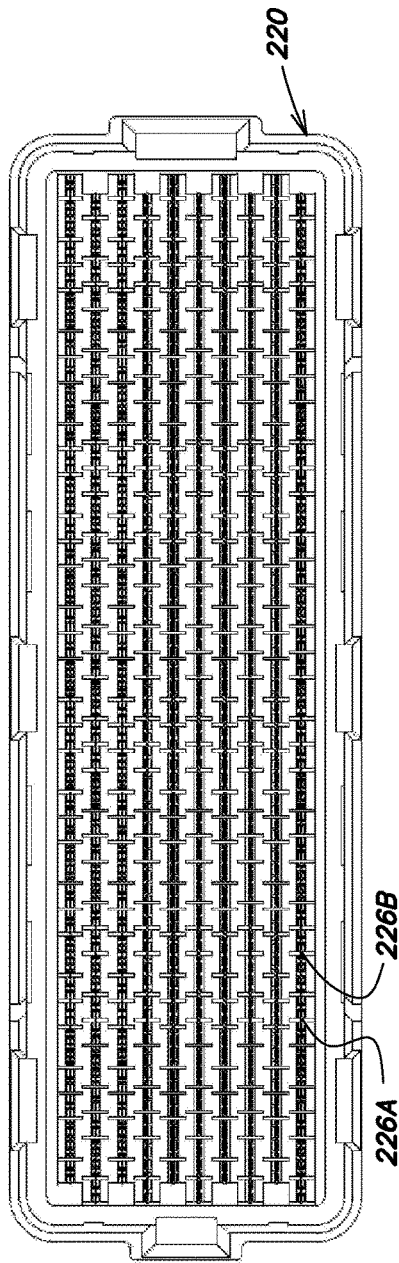
FIG. 2A
FIG. 2B

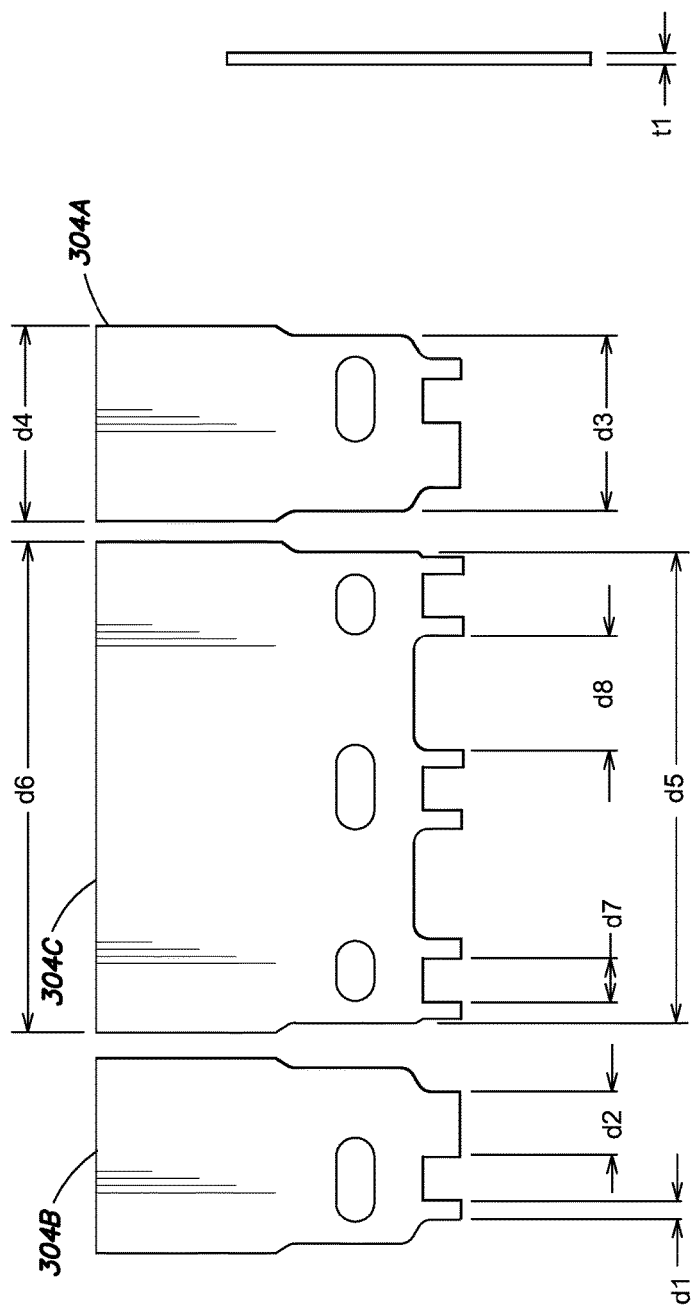

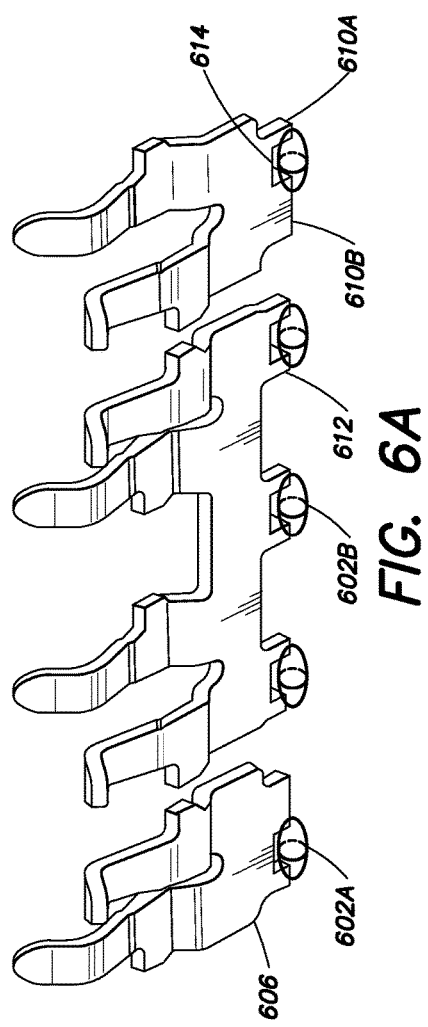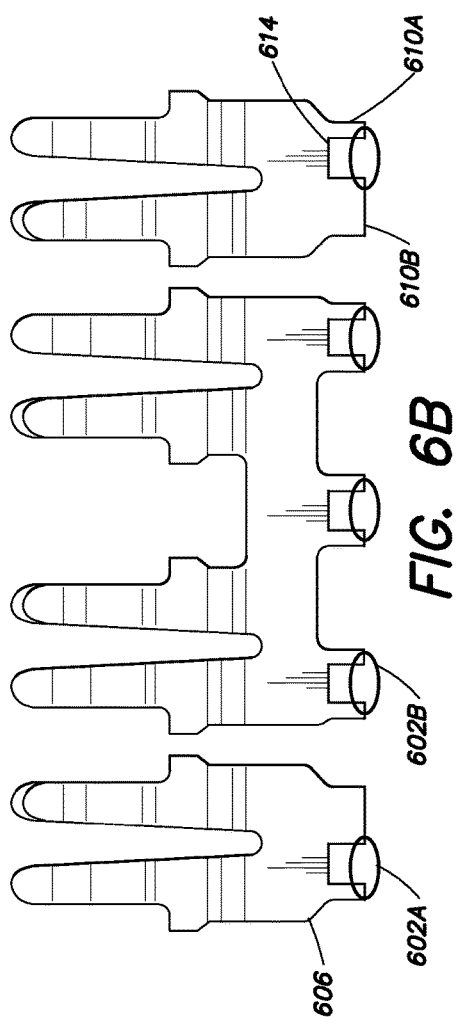

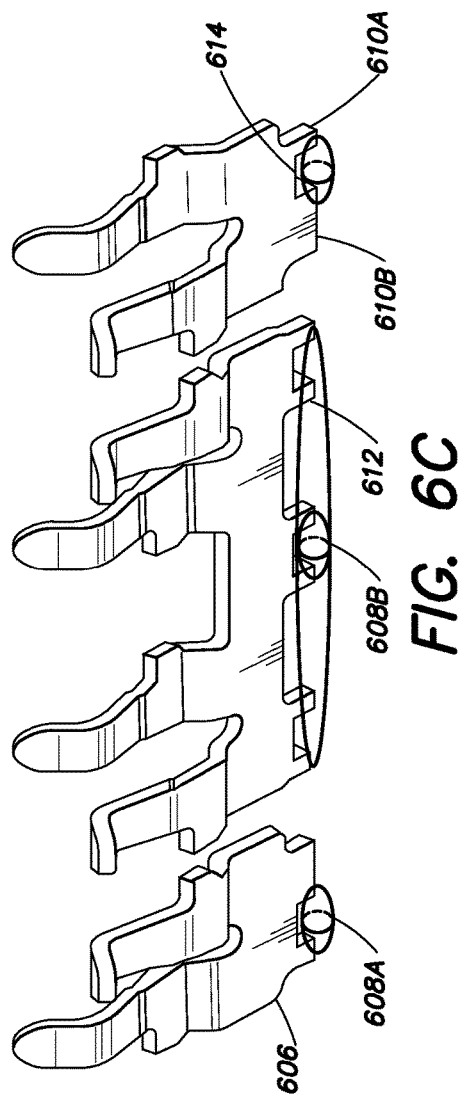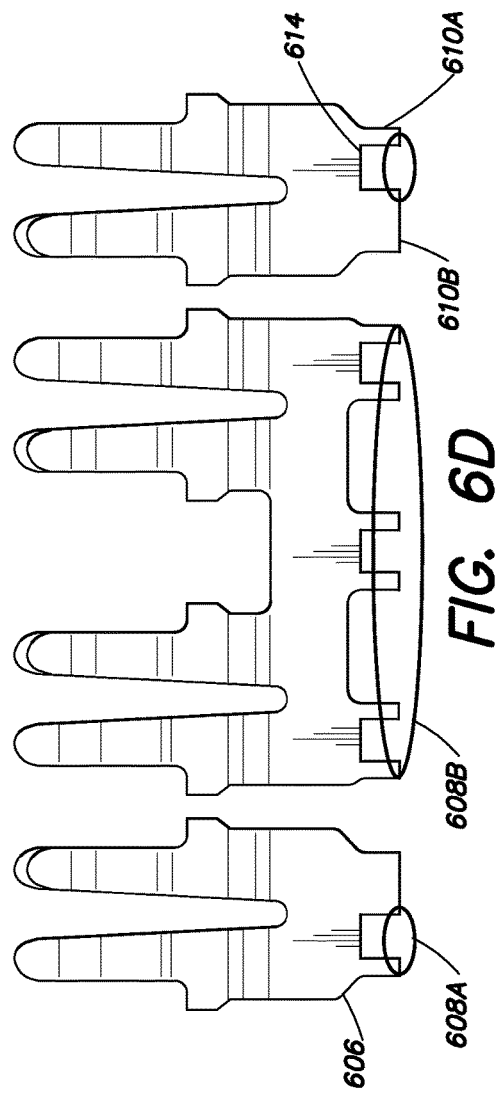

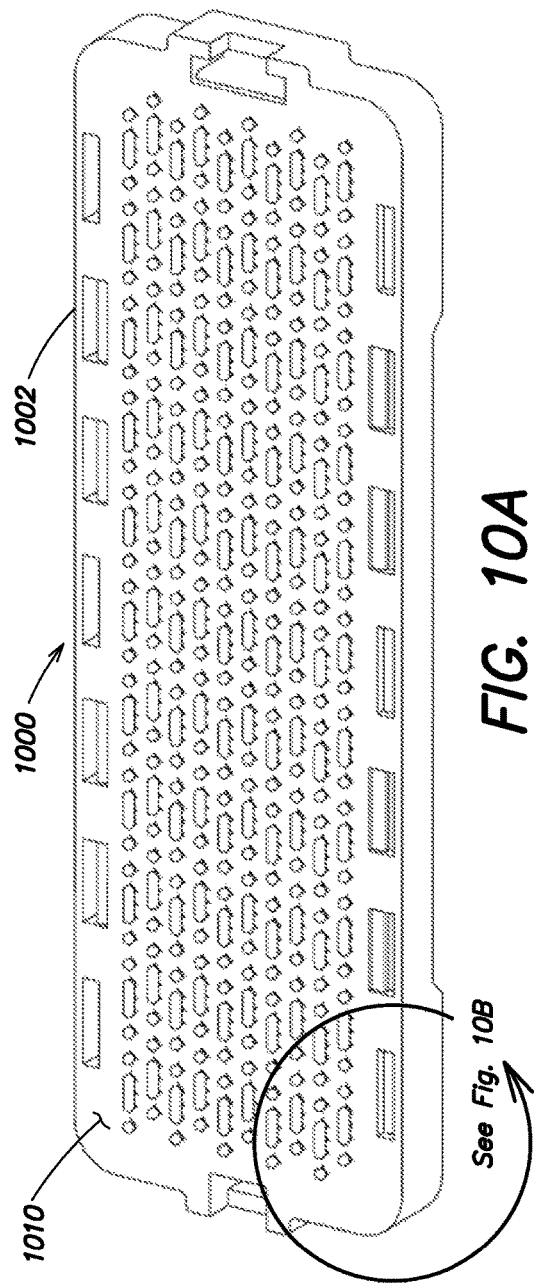
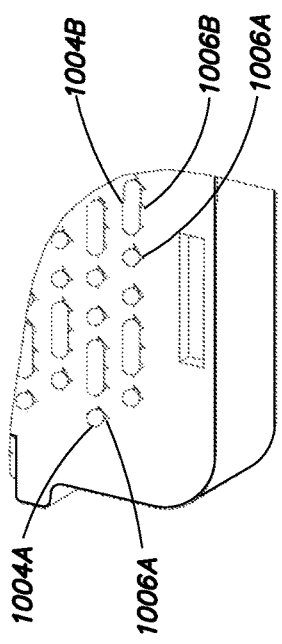

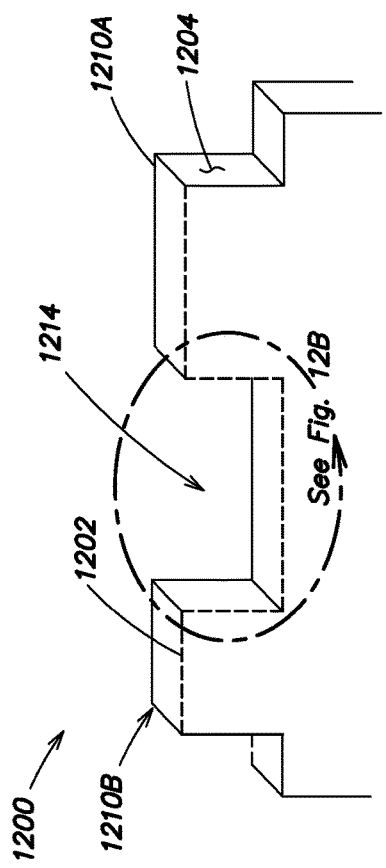
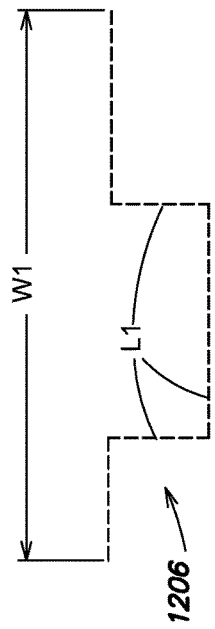
FIG. 12A
FIG. 12B

HIGH FREQUENCY BGA CONNECTOR

CROSS REFERENCE TO RELATED APPLICATIONS

This patent application claims priority to and the benefit of U.S. Provisional Patent Application Ser. No. 62/491,996, filed on Apr. 28, 2017 and entitled "High Frequency BGA Connector," which is hereby incorporated herein by reference in its entirety.

BACKGROUND

This application relates generally to interconnection systems, such as those including electrical connectors, used to interconnect electronic assemblies.

Electrical connectors are used in many electronic systems. It is generally easier and more cost effective to manufacture a system as separate electronic assemblies, such as printed circuit boards ("PCBs"), which may be joined together with electrical connectors. A known arrangement for joining several PCBs is to have one PCB serve as a backplane. Other PCBs, called "daughterboards" or "daughtercards", may be connected through the backplane.

A known backplane is a PCB onto which many connectors may be mounted. Conducting traces in the backplane may be electrically connected to signal conductors in the connectors so that signals may be routed between the connectors. Daughtercards may also have connectors mounted thereon. The connectors mounted on a daughtercard may be plugged into the connectors mounted on the backplane. In this way, signals may be routed among the daughtercards through the backplane.

Electrical connector designs have been adapted to mirror trends in the electronic industry. Electronic systems generally have gotten smaller, faster, and functionally more complex. Because of these changes, the number of circuits in a given area of an electronic system, along with the frequencies at which the circuits operate, have increased significantly in recent years. Current systems pass more data between PCBs and require electrical connectors that are electrically capable of handling more data at higher speeds than connectors of even a few years ago.

Electrical connectors typically include a dielectric connector housing supporting a plurality of electrical contacts. For example, electrical connectors can be constructed with arrays of electrical contacts having solder balls fused to mounting ends of the contacts. The mounting ends may be held in an array, creating a ball grid array (BGA) connector.

In a high density, high speed connector, electrical conductors may be so close to each other that there may be electrical interference between adjacent signal conductors. To reduce interference, and to otherwise provide desirable electrical properties, reference conductors are often placed between adjacent signal conductors.

BRIEF SUMMARY

Aspects of the present disclosure relate to improved high density, high speed interconnection systems. The inventors have recognized and appreciated techniques for configuring connector components to improve signal integrity for high frequency signals. These techniques may be used together, separately, or in any suitable combination.

Accordingly, some embodiments relate to a connector configured for attachment to a circuit board. The connector may have a housing with a surface facing the circuit board. The housing may have a plurality of pockets in the surface. The connector may have a plurality of contacts held by the housing, each comprising a mating end, a mounting end opposite the mating end and disposed within at least a respective one of the plurality of pockets, and an intermediate portion that extends between the mating end and the mounting end. The plurality of pockets in the surface of the housing may be arranged in a plurality of rows. Within each row, a first portion of the pockets may have a center-to-center spacing in a row direction from adjacent pockets of a first distance, and a second portion of the pockets have a center-to-center spacing in the row direction from at least one adjacent pocket of a second distance. The second distance may be less than the first distance.

In some embodiments, an electrical assembly may be provided. The electrical assembly may comprise a printed circuit board having a surface with a plurality of contact pads disposed thereon, a connector comprising a plurality of contacts, and a plurality of solder masses, each fused to a contact pad of the printed circuit board and a contact of the connector. The plurality of solder masses may comprise a first type and a second type disposed in a plurality of parallel rows extending in a row direction. Each of the plurality of solder masses may have a height perpendicular to the surface of the printed circuit board, a width, and a length in the row direction, the length being a multiple of the width. The length of a first type solder mass may be less than the length of a second type.

In another aspect, embodiments may relate to method of manufacturing a connector comprising a plurality of contacts, each comprising a mating end, a mounting end opposite the mating end, and an intermediate portion that extends between the mating end and the mounting end. The method may include forming a housing comprising a plurality of pockets to hold the plurality of contacts at a surface. The plurality of pockets may be arranged in a plurality of rows. Within each row, a first portion of the pockets may have a center-to-center spacing in a row direction from adjacent pockets of a first distance, and a second portion of the pockets have a center-to-center spacing in the row direction from at least one adjacent pocket of a second distance. The second distance may be less than the first distance. Subsequent to forming the housing, a plurality of solder balls may be positioned within the plurality of pockets. The method may further include heating the plurality of solder balls such that solder melts to form a plurality of solder masses attached to the mounting ends of the plurality of contact.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 1 is a perspective view of an electrical assembly constructed in accordance with some embodiments, including first and second electrical connectors mounted onto respective first and second printed circuit boards;

FIG. 2A is a perspective view of an electrical connector, showing the mating interface, according to some embodiments;

FIG. 2B is a plan view of the electrical connector in FIG. 2A;

FIG. 3B is a plan view of the set of electrical contacts in FIG. 3A;

FIG. 3C is a side view of the set of electrical contacts in FIG. 3A;

FIG. 6A is a perspective view of a set of electrical contacts of a receptacle electrical connector, schematically illustrating solder balls attached to the contact mounting ends, according to some embodiments;

FIG. 6B is a plan view of the set of electrical contacts in FIG. 6A;

FIG. 6C is a perspective view of a set of electrical contacts of a receptacle electrical connector, schematically illustrating solder masses attached to the contact mounting ends, according to some embodiments;

FIG. 6D is a plan view of the set of electrical contacts in FIG. 6C;

FIG. 10A is a perspective view of an electrical connector, showing the mounting interface with fused solder masses, according to some embodiments;

FIG. 10B is an enlarged perspective view of circled region 10B in FIG. 10A;

FIG. 12A is an enlarged perspective view of circled region 12A in FIG. 3A reversed 180 degrees, showing a mounting end of an electrical contact;

FIGS. 12B-12E are cross-sectional views of alternative embodiments of circled region 12B in FIG. 12A, illustrating examples of alternative edge profiles;

DETAILED DESCRIPTION

Figure 3A:
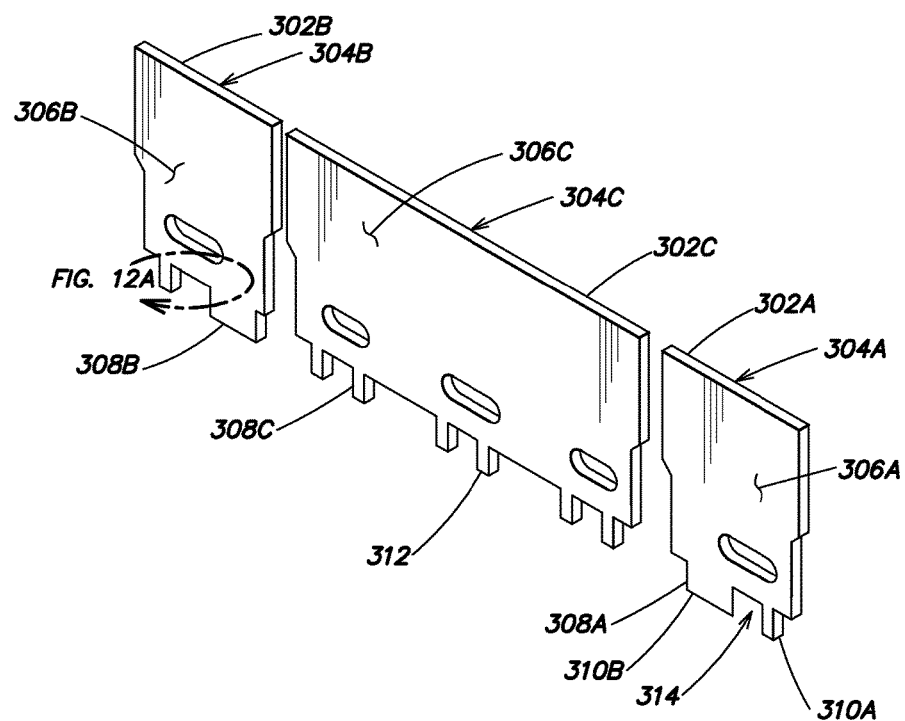
FIG. 3A is a perspective view of a set of electrical contacts of a plug electrical connector, according to some embodiments.

The inventors have recognized and appreciated connector designs that may increase the frequency of operation of connectors that are mounted to circuit assemblies, such as printed circuit boards, using solder balls. As a result, the connector may have very high density and operate at high frequencies, such as greater than 40 Gbps NRZ. In some embodiments, the connector may operate at 56 Gbps NRZ or higher.

One or more techniques may be used to reduce signal crosstalk. In some embodiments, the connectors may include a housing configured to position subsets of the solder balls close enough that, upon reflow of the solder balls to attach them to the mounting ends of the contacts in the connector or upon attachment of the connector to a circuit assembly, those subsets will fuse or otherwise be so closely spaced that they serve as a shield in the mounting interface of the connector. In accordance with some embodiments, the subsets may be attached to the mounting ends of wide contacts positioned within the connector to serve as reference conductors. Such a configuration may reduce crosstalk, or provide other desired characteristics, particularly for connectors with densely spaced signal conductors.

Some embodiments may relate to a connector including two types of contacts with the second type contacts being wider than the first type contacts. In some embodiments, the first type contacts may be designated as signal conductors and the second type contacts may be designated as reference conductors. One of ordinary skill in the art would recognize signal and reference conductors based on their shape and position within a connector. The mounting ends of the first type contacts may include two projections with the second projection being wider than the first projection. The mounting ends of the second type contacts may include at least four projections. The at least four projections may have the same width. The second projection of a first type contact may be adjacent to and extends towards an adjacent projection of a reference contact.

In some embodiments, a connector housing may comprise a surface configured to face a circuit board when the connector is mounted to the circuit board. The housing may include a plurality of pockets in the surface. The plurality of pockets may be arranged in a plurality of rows. Within each row, a first portion of the pockets may have a center-to-center spacing in a row direction from adjacent pockets of a first distance, and a second portion of the pockets have a center-to-center spacing from at least one adjacent pocket of a second distance, wherein the second distance is less than the first distance. For example, pockets receiving mounting ends of signal conductors may be spaced from each other by a greater distance than pockets receiving mounting ends of reference conductors.

In some embodiments, the pockets of the first portion may comprise a first region and a second region. The second region may include a slot that extends from the first portion towards an adjacent pocket in the second portion. Each first portion pocket may receive a mounting end of a first type contact, and each second type pocket may receive a portion of a mounting end of a second type contact.

In some embodiments, the connector may include solder masses within the pockets and fused to mounting ends of contacts. Solder masses within the second portion of the pockets may be fused to solder masses in at least one adjacent pocket of the second portion.

Alternatively or additionally, higher operating frequency may be achieved with contacts shaped to receive solder balls at their mounting ends but with lower inductance than conventional BGA-type connectors. In accordance with some embodiments, the mounting ends may include first and second projections separated by a space with the second projection being wider than the first projection.

In accordance with some embodiments, connectors may include contacts shaped to receive solder balls at their mounting ends so as to provide better signal integrity. Improvements in signal integrity may result from more uniform impedance of signal paths through the mounting interface. The mounting ends may be shaped to support a flux pin transfer approach for attaching solder balls to the contacts, which, in comparison to approaches using solder paste, may provide a smaller and more uniform amount of conductive material at the mounting interface for each signal contact.

A smaller amount of conductive material may result in smaller impedance discontinuities along the signal paths, which tend to degrade signal integrity. Smaller impedance discontinuities, in turn, enables other portions of the interconnection system to be reliably designed to account for the impedance of the mounting interface such that the impact of any impedance discontinuities may be lessened by compensating for those discontinuities in the design of other portions of the interconnection system.

In accordance with some embodiments, the mounting ends may have edges that are solder-wettable with surfaces joining the edges having a non-solder wettable coating. The mounting ends of at least some of the contacts may include projections that extend into pockets formed in a surface of a housing configured for mounting against the circuit assembly. These projections may have edges that are solder-wettable, which may aid in attachment of the solder balls to the contacts. The edges may be made solder-wettable by application of solder flux, such as through the use of a flux pin transfer technique. Alternatively or additionally, the edges may be made solder-wettable by coating a solder-wettable layer to the edges, such as a layer of copper, gold, nickel, nickel-vanadium alloy, or any other suitable materials in any suitable combinations.

In some embodiments, the mounting ends of the signal contacts may be shaped to lessen the impact of narrowed portions resulting from shaping the ends for solder ball attachment, which can also induce impedance discontinuities that may impact performance. The projections at the mounting ends of at least some of the contacts may be non-uniform in width, with one projection being wider than the other. Widening a projection in this way may decrease inductance of the mounting end of the contact, increasing the resonant frequency of the contacts to be outside the operating range of the connector. In a connector in which some contacts are designated as signal conductors and some are designated as reference conductors, the asymmetrical projections may be on at least the signal conductors, with the wider projections on the signal conductors extending toward an adjacent ground.

FIG. 1 illustrates an electrical assembly 10 constructed in accordance with some embodiments. Electrical assembly 10 includes a first electrical connector 100, a first printed circuit board (PCB) 101, a second electrical connector 200, and a second PCB 201.

Electrical connector 100 may include a connector housing 102, an array of electrical contacts (not shown), a mounting surface 110, and a mating interface (not shown). At least a portion of the connector housing may be made of any suitable dielectric material, such as plastic, so as to provide electrical isolation between electrical contacts. Additionally, the connector housing may include conductive or lossy portions, which in some embodiments may provide conductive or partially conductive paths between some of the electrical contacts. The electrical contacts may be made of any suitable electrically conductive material such as metal. The connector housing may be configured to support the array of electrical contacts. In some embodiments, the connector housing may be overmolded onto the electrical contacts. Alternatively, the electrical contacts may be stitched into the connector housing or otherwise supported by the connector housing as desired.

Each of the electrical contacts may include an intermediate portion that connects a mounting end to a mating end. The electrical contacts may have fusible elements, such as solder balls 108, fused to their mounting ends such that the electrical connector 100 is placed in electrical communication with printed circuit board (PCB) 101 by conduction paths from the electrical contacts through the fusible elements to contact pads on a surface of the PCB. The fusible elements may be reflowed, such as through a conventional surface mount reflow operation, to electrically and mechanically affix the fusible elements to conductive pads on a surface of the PCB.

Connector housing 102 may have an array of pockets 106 in the mounting surface 110. The connector is configured for attachment to a circuit assembly with the mounting surface facing the circuit assembly, which is the first PCB 101 in this example. Each pocket may be sized and positioned to at least partially receive a mounting end of an electrical contact and a respective solder mass, here illustrated as solder balls 108 attached to the mounting end of the electrical contact. Within each row, the contacts may be arranged in a repeating pattern such as a signal-signal-ground pattern, a ground-signal-signal pattern, or a signal-ground-signal pattern. The contacts may also be arranged in a repeating signal-signal-ground-ground pattern, a ground-signal-signal-ground pattern, or a signal-ground-signal-ground pattern. Each row of the array of pockets may also be arranged in a corresponding repeating pattern to receive the mounting ends of the contacts.

Electrical connector 200 may include a connector housing 202, an array of electrical contacts 204, a mounting surface (not shown), and a mating interface 212. The array of electrical contacts 204 can be constructed the same or differently than the array of electrical contacts of the electrical connector 100. The array of electrical contacts 204 may have fusible elements, such as solder masses (not shown), fused to their mounting ends such that the electrical connector 200 is placed in electrical communication with printed circuit board 201 by conduction paths from the electrical contacts through the solder masses to contact pads on a surface of the PCB.

Connector housing 202 may have an array of pockets in the mounting interface (not shown). The connector is configured for attachment to a circuit assembly with the mounting surface facing the circuit assembly, which is the second PCB 201 in this example. Each pocket may be sized and positioned to at least partially receive a mounting end of an electrical contact and a respective solder mass attached to the mounting end of the electrical contact.

In some embodiments, the electrical contacts may comprise first type contact 204A and second type contact 204B with the second type being wider than the first type along a direction parallel to the mounting surface. In some embodiment, the first type contacts may be designated as signal conductors and the second type contacts as ground conductors. The mounting end of each ground contact may occupy more pockets than the mounting end of each signal contact. In the embodiment illustrated, the mounting end of each signal contact is inserted into a single pocket while each ground contact has a plurality of mounting ends, here three, each with a corresponding pocket. It should be appreciated that ground conductors need not be connected to earth ground, but are shaped to carry reference potentials, which may include earth ground, DC voltages or other suitable reference potentials. The "ground" or "reference" conductors may have a shape different than the signal conductors, which are configured to provide suitable signal transmission properties for high frequency signals. One of ordinary skill in the art would recognize signal and reference conductors based on their shape and position.

In some embodiments, electrical connector 200 is configured to be mated with electrical connector 100 so as to be in electrical communication with electrical connector 100. In some embodiments, electrical connector 200 may be constructed substantially identically to electrical connector 100.

FIG. 2A and FIG. 2B shows a perspective view and a plan view of the mating interface of electrical connector 220 respectively. Electrical connector 220 may include a plurality of electrical contacts 224A, 224B arranged into a plurality of rows extending in a row direction.

In some embodiments, electrical contacts 224A may conduct signals and electrical contacts 224B may conduct reference voltage levels and may additionally shield signals from crosstalk. Within each row, contacts 224A may be arranged in pairs with contacts 224B positioned between adjacent pairs such that the reference contacts may shape electric fields to avoid crosstalk induced in an adjacent row by constraining the fields around a single pair of signal contacts to be in the same row. Additionally, this arrangement may prevent undesired signal propagation along the row. In some embodiments, within each row, the electrical contacts may be arranged as a repeating pattern of sets of electrical contacts. One set of electrical contacts may include one electrical contact 224B placed between two electrical contacts 224A. In the illustrated embodiment, the width of one electrical contact 224B is greater than the width of one electrical contact 224A along the row direction.

At the mounting ends, an electrical contact 224A may be spaced from an adjacent electrical contact 224A by a distance 226A and be spaced from an adjacent electrical contact 224B by a distance 226B. In some embodiments, distances 226A and 226B may be substantially equal. In another embodiments, space 226B may be greater or less than space 226A. Corresponding distances between the contacts for the intermediate portions and/or the mounting end may be the same as or different from distances 226A, 226B.

The plurality of electrical contacts 224A, 224B may be arranged into at least two type of rows that extend along the row direction. In some embodiments, a first type row may be offset from a second type row by a distance in the row direction such that reference contacts 224B in each row may be offset, in the row direction, toward signal contacts 224A in an adjacent row. The offset distance may be a fraction of center to center spacing between signal contacts, depicted as distance 226A, such as between 10% and 90% of the center-to-center spacing, between 20% and 80%, between 25% and 75%, or any value within such ranges. Alternatively, the distance may be a fraction of the signal to ground spacing, such as is represented by distance 226B. That fraction may be, for example, between 15% and 95%, between 25% and 85%, between 30% and 80%, or any value within such ranges. In the illustrated embodiments, five first type rows and five second type rows are arranged in an alternating pattern. However, the electrical contacts can be configured into any numbers of rows and any types of rows in any pattern.

The inventors have recognized and appreciated that geometry of electrical contacts of the electrical connectors can improve signal integrity (SI) of an electrical assembly at high frequency. For example, a geometry at the mounting ends of the electrical contacts that provides a more uniform contact width at the mounting end than a conventional design in which the contact width is necked down to provide a solder ball attachment has a more uniform inductance along signal paths from a connector to a printed circuit board to which the connector is attached. The geometry at the mounting ends of the electrical contacts can also enable precise positioning of solder balls while reducing the need for solder paste, leading to ball attachments with less fusible material than conventional BGA-type connectors. Less mass at the mounting portion reduces changes of impedance along the signal path of a connector and enables more repeatable manufacturing processes, particularly for small solder balls, which reduces part-to-part variations.

FIGS. 3A to 3C illustrates one set of electrical contact of a plug electrical connector, according to some embodiments, which may be a portion of a row. One set of electrical contact may include contact 304A, contact 304B which is a mirrored version of contact 304A, and contact 304C positioned between the contacts 304A and 404B. In some embodiments, electrical contacts 304A and 304B may conduct signals and electrical contacts 304C may conduct reference potentials. The electrical contacts 304A, 304B, and 304C may have respective mating ends 302A, 302B, and 302C that may extend out from the mating interface 212, respective opposed mounting ends 308A, 308B, and 308C that may be disposed within pockets 106 in the mounting surface 110, and respective intermediate portions 306A, 306B, and 306C that may extend between the mating ends and the mounting ends.

The mounting end of an electrical contact 304A may have a space 314 separating first and second projections 310A, 310B. The spaces may be formed by stamping the mounting ends of the contacts or any other suitable methods. The width of the second projection d2 may be greater than the width of the first projection d1. In some embodiments, d2 may be in the range of 20 mil to 60 mil, and d1 may be in the range of 5 mil to 40 mil. In some embodiments, the second projection may project from intermediate portion 306A that is adjacent to the electrical contact 304C. In the embodiment illustrated, the spaces are rectangular. Such spaces increase the distance along the edge of electrical contact 304A exposed at the mounting end. In accordance with some embodiments, portions of the contacts, including the mounting ends, may be coated with nickel or other metal that resists oxidation and/or undesired solder wicking. Such coatings may reduce the affinity of the solder to adhere to the mounting ends of the contacts. Whether or not such a coating is used, the edges of the mounting ends may be totally or partially coated with a solder flux that promotes adhesion of a solder ball to the electrical contact 304A during a reflow operation. Additionally, the space provides a shape to the mounting end that tends to hold the solder ball in a desired position, centered in the center of the space. Further, the spaces increase the perimeter of the edge of the mounting end of the contact where a solder ball is fused to the contact. A rectangular space provides a suitable increase in the amount of exposed edge. However, it is not a requirement that the spaces are rectangular, and in some embodiments, different shapes may be used, such as triangular, dovetail, semi-circular, half-oval, or any other suitable opening shape.

As illustrated in the exemplary embodiment of FIGS. 3A and 3B, the mounting end of an electrical contact 304C may have pairs of projections 312 separated by spaces. Each of a pair of projections may be separated from the other by a distance d7. A pair of projections may be separated from an adjacent pair by a distance d8. In some embodiments, d8 may be greater than d7. In some embodiments, the projections of a pair may have different widths. In some embodiments, the mounting ends of an electrical contact 304C may include at least four projections. The at least four projections may have a same width.

In the illustrated embodiment, the electrical contacts 304A, 304B, and 304C are configured as a plug contact. Thus, the mating ends 302A, 302B, and 302C may define a blade with a thickness t1. The width of the mating end of an electrical contact 304C d6 may be greater than the width of the mating end of an electrical contact 304A d4. In some embodiments, d6 may be twice or three times of d4.

The width of the intermediate portion of an electrical contact 304A d3 may be substantially similar to the width of the mating end of the electrical contact 304A d4. In some embodiments, d4 may be greater than d3. In some embodiments, d3 may be greater than 80% of d4, such as between 90% and 100%, or any value within such ranges. Similarly, the width of the body of an electrical contact 304C d5 may be substantially similar to the width of the mating end of the electrical contact 304C d6. In some embodiments, d6 may be greater than d5. In some embodiments, d5 may be greater than 80% of d6, between 90% and 100%, or any value within such ranges. By having similar widths as the intermediate portion, the mating end and the solder ball attached to the mating end, electrical performance of the connector may be increased.

The inventors have recognized and appreciated that the edges at the mating end by having projections non-uniform in width creates larger contact surfaces. Moreover, this shape at the mating end can reduce inductance and thus impact the frequency at which resonance happens and result in a higher Q-factor. For example, in a non-limiting embodiment, the operation frequency of an electrical connector are increased to 56 GHz, such that the connector may operate at frequencies greater than 26 GHz.

Figure 4A:
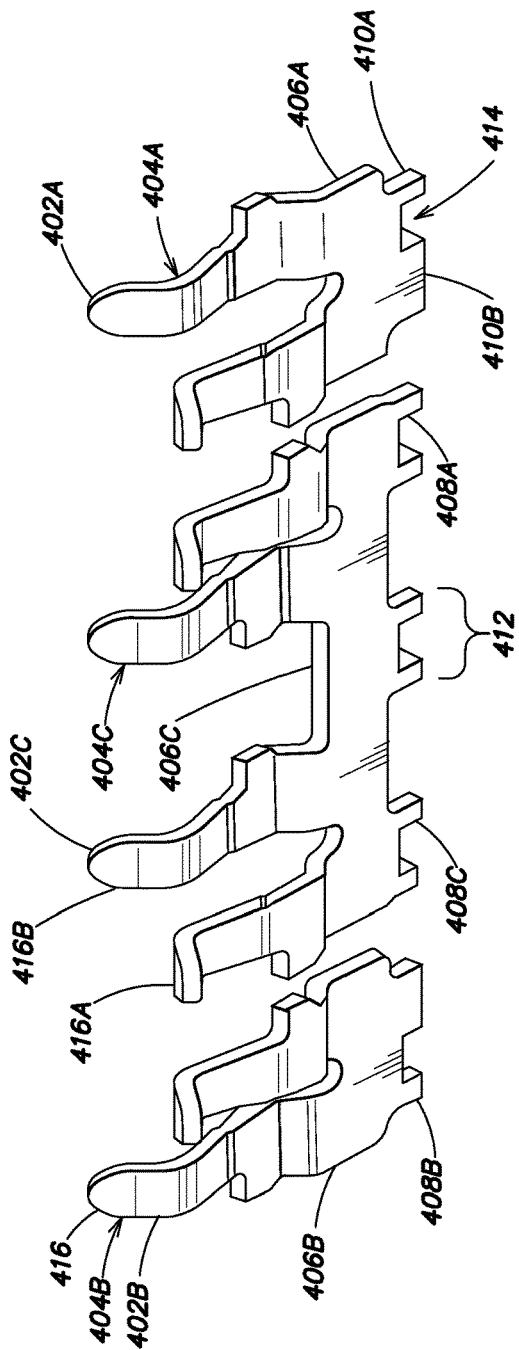
FIG. 4A is a perspective view of a set of electrical contacts of a receptacle electrical connector, according to some embodiments.
Figure 4C:
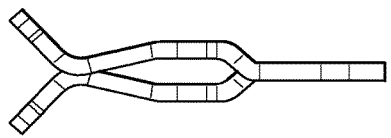
FIG. 4C is a side view of the set of electrical contacts in FIG. 4A.
Figure 4B:
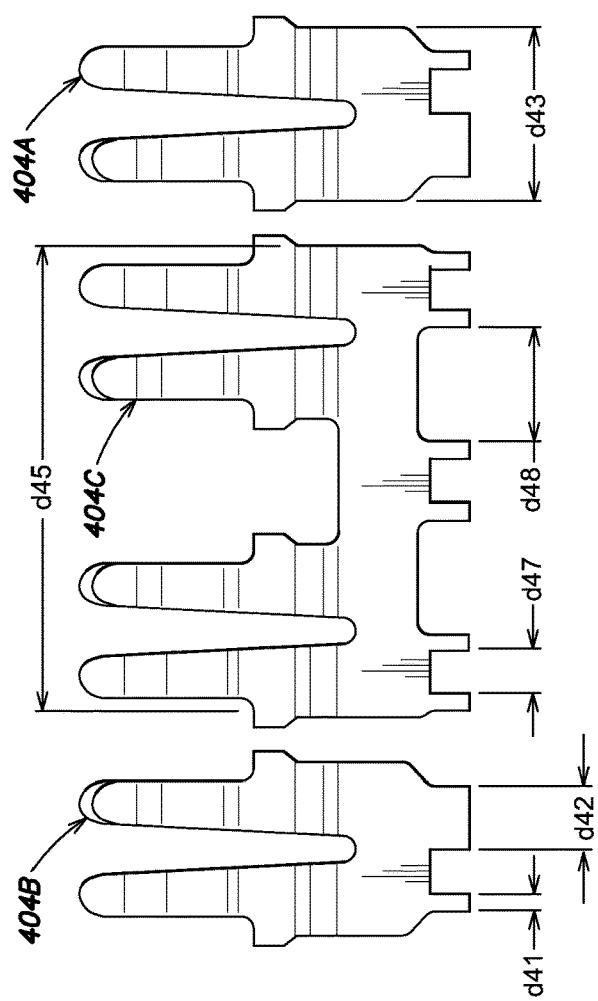
FIG. 4B is a plan view of the set of electrical contacts in FIG. 4A.

FIGS. 4A to 4C illustrates one set of electrical contact of a receptacle electrical connector, according to some embodiments, which may be a portion of a row. One set of electrical contact may include contact 404A, contact 404B which is a mirrored version of contact 404A, and contact 404C positioned between the contacts 404A and 404B. In some embodiments, electrical contacts 404A and 404B may conduct signals and electrical contacts 404C may conduct reference potentials. The electrical contacts 404A, 404B, and 404C may have respective mating ends 402A, 402B, and 402C that may extend out from the mating interface 212, respective opposed mounting ends 408A, 408B, and 408C that may be disposed within pockets 106 in the mounting surface 110, and respective intermediate portions 406A, 406B, and 406C that may extend between the mating ends and the mounting ends.

The mounting end of an electrical contact 404A may have a space 414 separating first and second projections 410A, 410B. The width of the second projection d42 may be greater than the width of the first projection d41. In some embodiments, d42 may be in the range of 20 mil to 60 mil, and d41 may be in the range of 5 mil to 40 mil. In some embodiments, the second projection may project from intermediate portion 406A that is adjacent to the electrical contact 404C. In the embodiment illustrated, the spaces are rectangular. Such spaces increase the distance along the edge of electrical contact 404A exposed at the mounting end. In accordance with some embodiments, that edge may be coated with a solder flux that promotes adhesion of a solder ball to the electrical contact 404A during a reflow operation. Additionally, the space provides a shape to the mounting end that tends to hold the solder ball in a desired position, centered in the center of the space. A rectangular space provides a suitable increase in the amount of exposed edge. However, it is not a requirement that the spaces are rectangular, and in some embodiments, different shapes may be used, such as triangular, dovetail, semi-circular, half-oval, or any other suitable opening shape.

The mounting end of an electrical contact 404C may have pairs of projections 412 separated by spaces. Each of a pair of projection may be separated from the other by a distance d47. A pair of projections may be separated from an adjacent pair by a distance d48. In some embodiments, d48 may be greater than d47. In some embodiments, the projections of a pair may have different widths. In some embodiments, the mounting ends of an electrical contact 404C may include at least four projections. The at least four projections may have a same width.

In the illustrated embodiment, as described in U.S. Pat. No. 6,042,389, which is incorporated by reference as if set forth in its entirety herein, the electrical contacts 404A, 404B, and 404C are configured as a receptacle contact. Each of the mating ends 402A, 402B, and 402C may include at least one pair of cantilevered spring arms 416A and 416B that each extend out from a respective intermediate portion. Each spring arm 416A, 416B may be resiliently supported by the respective intermediate portion and may extend out from the respective intermediate portion to a respective free distal tip 416.

The width of the intermediate portion of an electrical contact 404C d45 may be greater than the width of the body of an electrical contact 404A d43. In some embodiments, d45 may be twice or three times of d43.

The inventors have recognized and appreciated that intentionally placing solder spheres close enough so that they bridge together when heated above their melting temperature will create an elongated solder mass or shield, which reduces signal crosstalk more efficient than the shield formed by individual solder spheres.

Figure 5A:
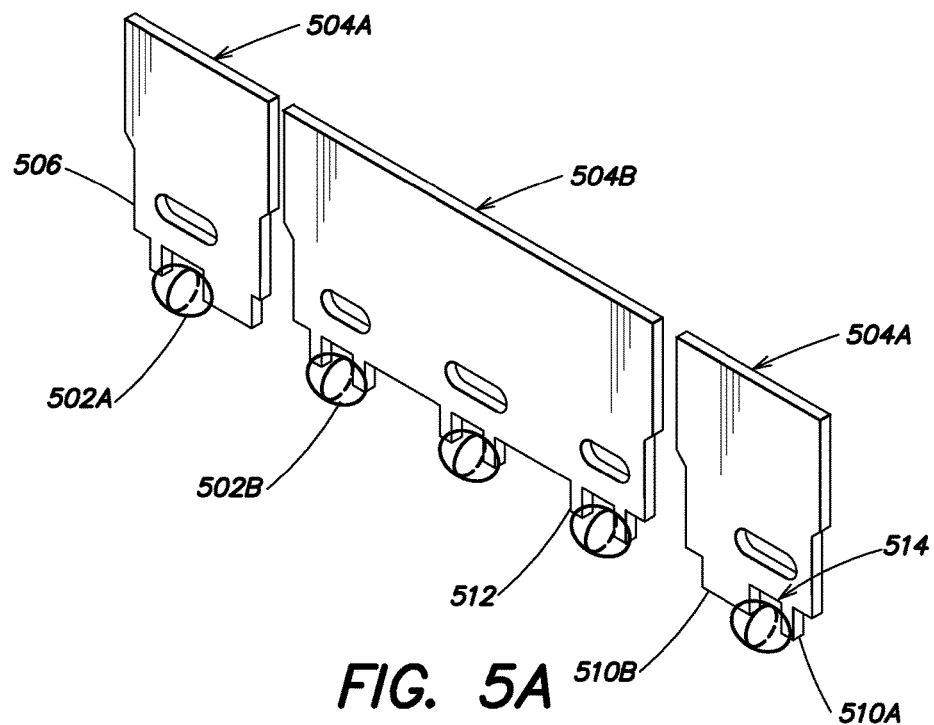
FIG. 5A is a perspective view of a set of electrical contacts of a plug electrical connector, schematically illustrating solder balls attached to the contact mounting ends, according to some embodiments.
Figure 5B:
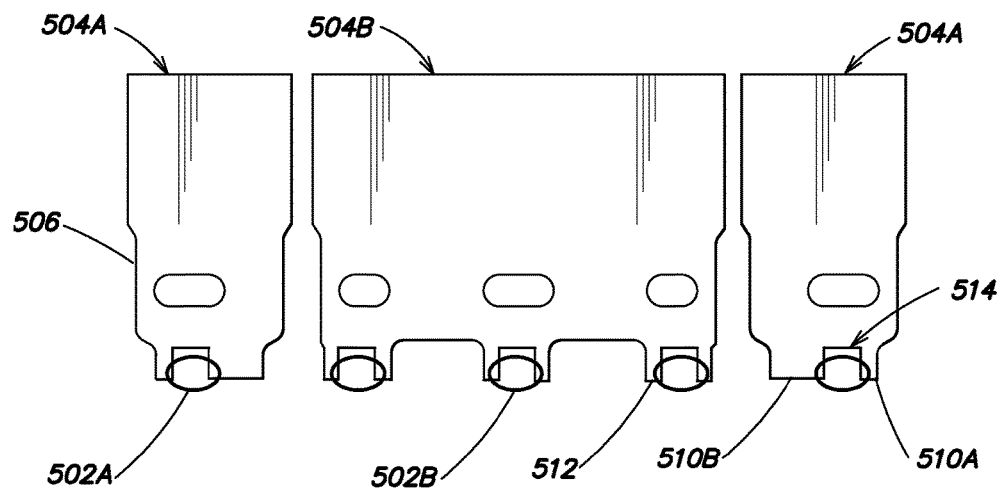
FIG. 5B is a plan view of the set of electrical contacts in FIG. 5A.

FIGS. 5A-5B illustrates a set of electrical contacts 504A, 504B of a plug electrical connector, schematically illustrating solder balls 502A, 502B attached to the mounting ends. In some embodiments, the diameter of the solder balls may be in the ranges of 4 mil to 30 mil, 10 mil to 25 mil, or any value within these ranges. The solder balls may be made of lead, tin, copper, silver, bismuth, indium, zinc, antimony, traces of other metals, and any combination thereof. The electrical contacts may have gold plating down to plug blade 506. As a result, the gold zone is very close to the tips with solder balls. If solder balls touch gold, it will wick. To prevent solder balls from wicking, the electrical contacts may have nickel plating at their mounting ends, including projections 510A, 510B, and 512. However, the coating used, in some embodiments, may be non-wettable with solder. Nonetheless, the edges of spaces 514 of the mounting ends of the contacts may be solder wettable as the result of a coating, such as of solder flux. The surfaces joining the edges of the spaces may have a non-solder wettable coating. As a result, solder balls may be precisely positioned in the vicinity of the spaces.

Figure 13A:
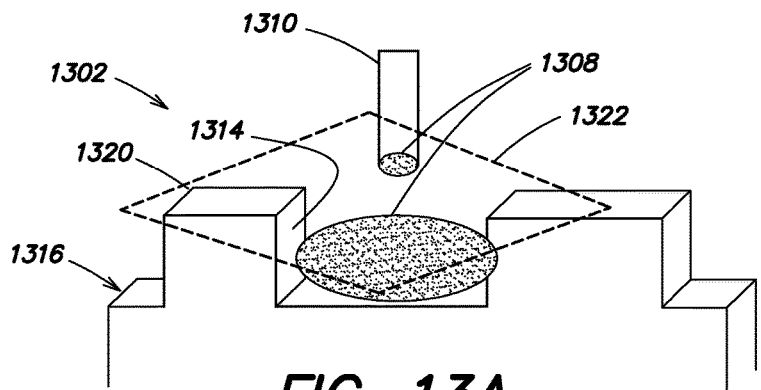
FIGS. 13A-13C are schematic illustration of successive steps in a method of manufacturing a connector described herein, according to some embodiments.
Figure 13B:
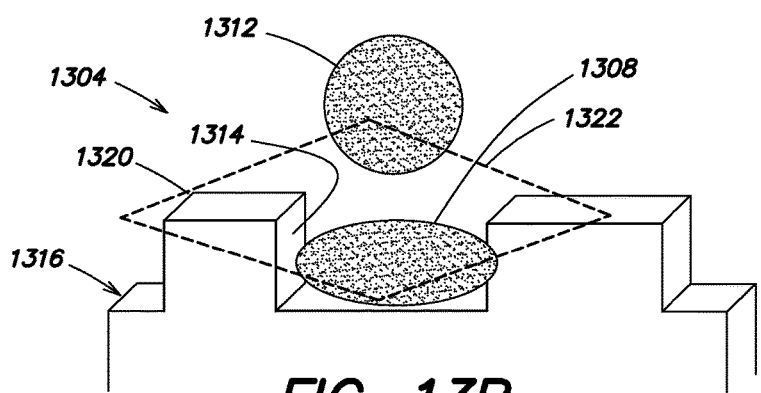
Figure 13C:
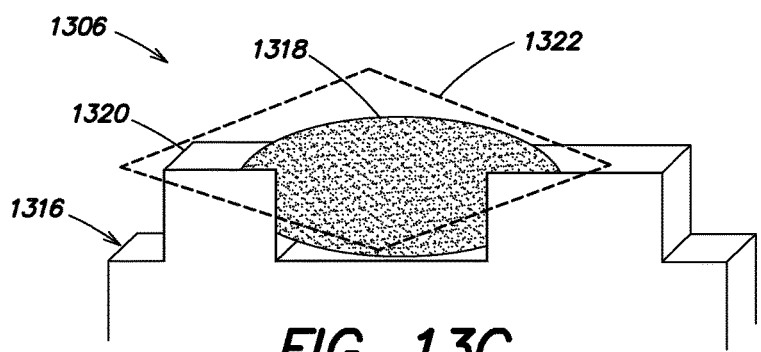

In some embodiments, a method of manufacturing of a connector including a plurality of contacts 504A, 504B held by a housing comprising a plurality of pockets in a surface, wherein the connector is configured for attachment to a circuit assembly with the surface facing the circuit assembly, the method may include: 1) applying solder flux to the edges of the contacts; 2) positioning a plurality of solder balls adjacent the edges of the contacts; and 3) heating the plurality of solder balls such that solder melts to form solder masses that attach to the mounting ends of the plurality of contacts. A schematic example of the manufacturing method is illustrated in FIGS. 13A-13C.

Figure 5C:
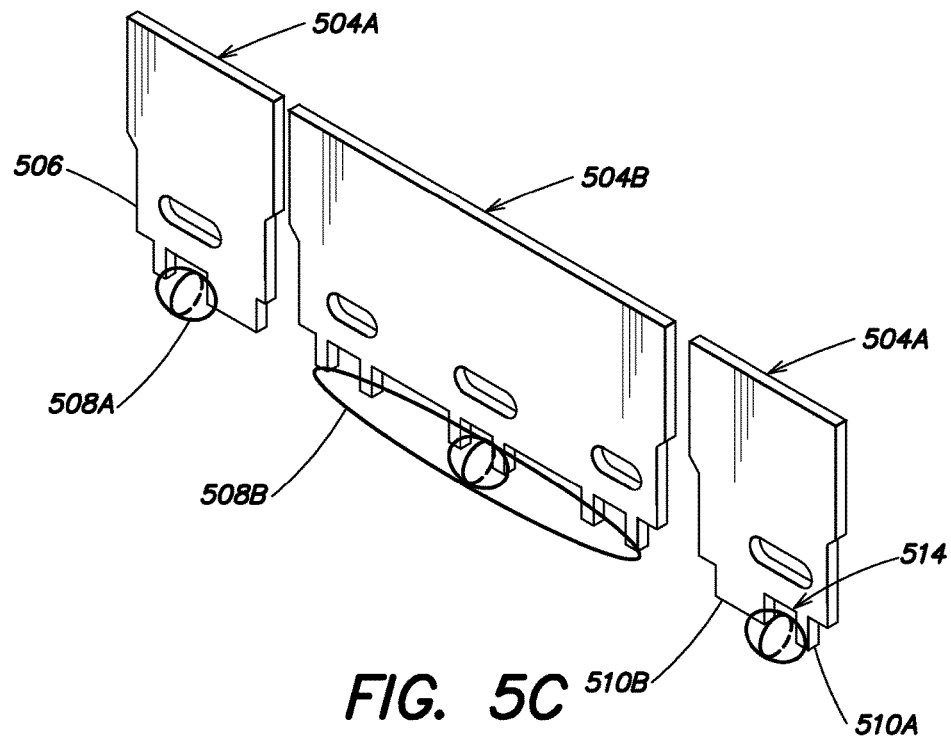
FIG. 5C is a perspective view of a set of electrical contacts of a plug electrical connector schematically illustrating solder masses attached to the contact mounting ends, according to some embodiments.
Figure 5D:
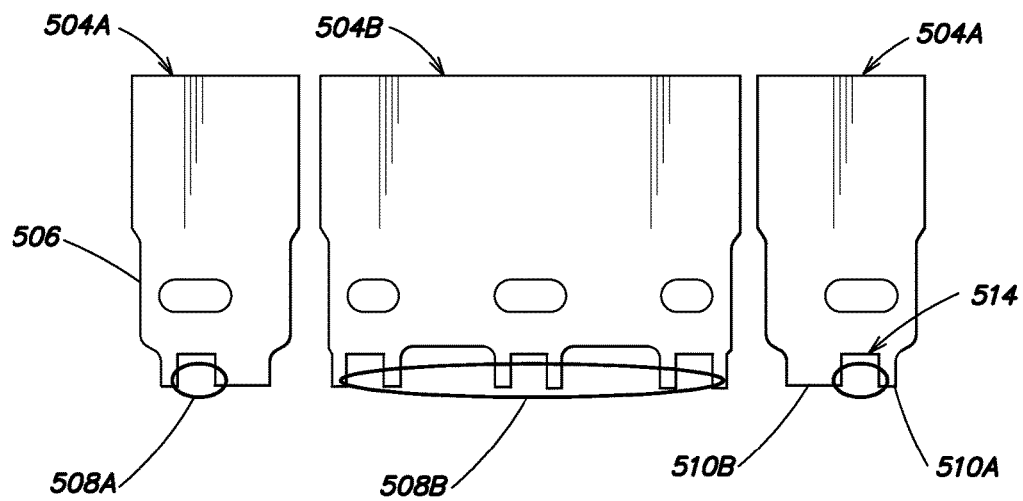
FIG. 5D is a plan view of the set of electrical contacts in FIG. 5C.

In some embodiments, during the heating step, the signal solder balls 502A may remain disconnected from each other and from the reference solder balls 502B and form solder masses 508A (FIGS. 5C-D). In some embodiments, during the heating step, the reference solder balls 502B may also remain disconnected from each other and from the signal solder balls 502A. In other embodiments, during the heating step, the reference solder balls 502B may fuse with at least one adjacent reference solder ball and form solder masses 508B (FIGS. 5C-D). Each of solder masses 508A, 508B has a height, a width, and a length. The solder masses may be elongated such that the length is a multiple of the width. In some embodiment, the lengths of solder masses 508A are less than the lengths of solder masses 508B. In some embodiment, each of solder masses 508B may have a volume and/or mass that is equal to a combined mass of a plurality of solder masses 508A. By the term "equal", it is meant to be within variations expected in the manufacturing process, such as within +/−10%, +/−5%, or any value within the ranges.

FIGS. 6A-B illustrates a set of electrical contacts of a receptacle electrical connector, schematically illustrating solder balls 602A, 602B attached to the mounting ends. FIGS. 6C-D illustrates a set of electrical contacts of a receptacle electrical connector, schematically illustrating solder masses 608A, 608B attached to the mounting ends. The difference between FIGS. 6A-D and FIGS. 5A-D is that electrical contacts in FIGS. 6A-D are configured as receptacle type while electrical contact in FIGS. 5A-D are configured as plug type. The mounting ends of the contacts in FIGS. 5A-D and FIGS. 6A-D may be the same. Similar processes may be used to attach solder balls 602A and 602B to the mounting ends and form solder masses 608A and 608B. For the brevity of the writing, descriptions are not repeated herein.

Figure 7A:
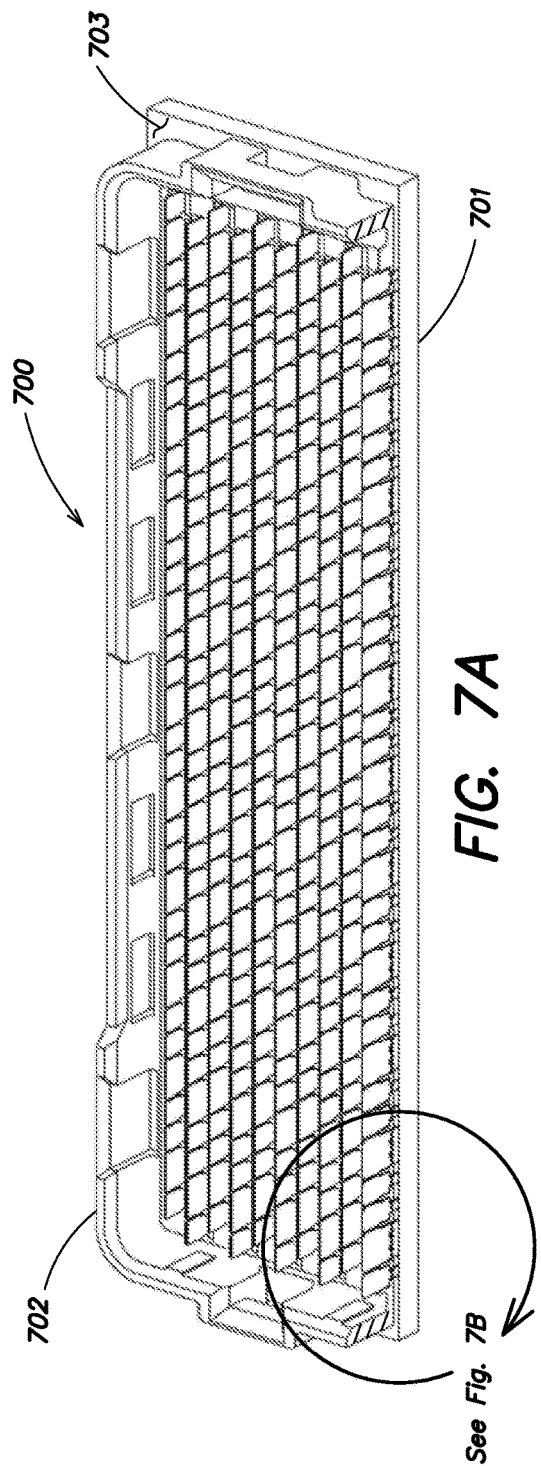
FIG. 7A is a perspective view of a plug electrical connector, partially cut away, mounted to a printed circuit board, according to some embodiments.
Figure 7B:
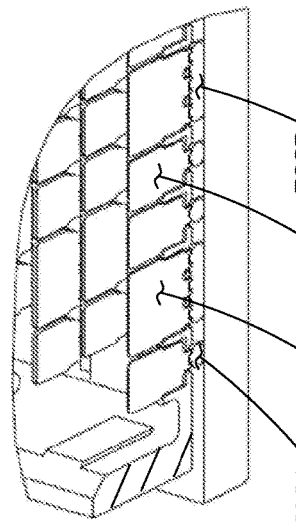
FIG. 7B is an enlarged perspective view of circled region 7B in FIG. 7A.

FIGS. 7A-B illustrate a perspective view of an electrical assembly formed by mounting a plug electrical connector 700, partially cut away, to PCB 701 through solder masses. In some embodiments, connector 700 may be constructed substantially identical to connector 100 or 200. In some embodiments, connector 700 may include contact sets substantially identical to contact sets shown in at least one of FIGS. 3A-C, FIGS. 4A-C, FIGS. 5A-D, and FIGS. 6A-D.

Figure 11A:
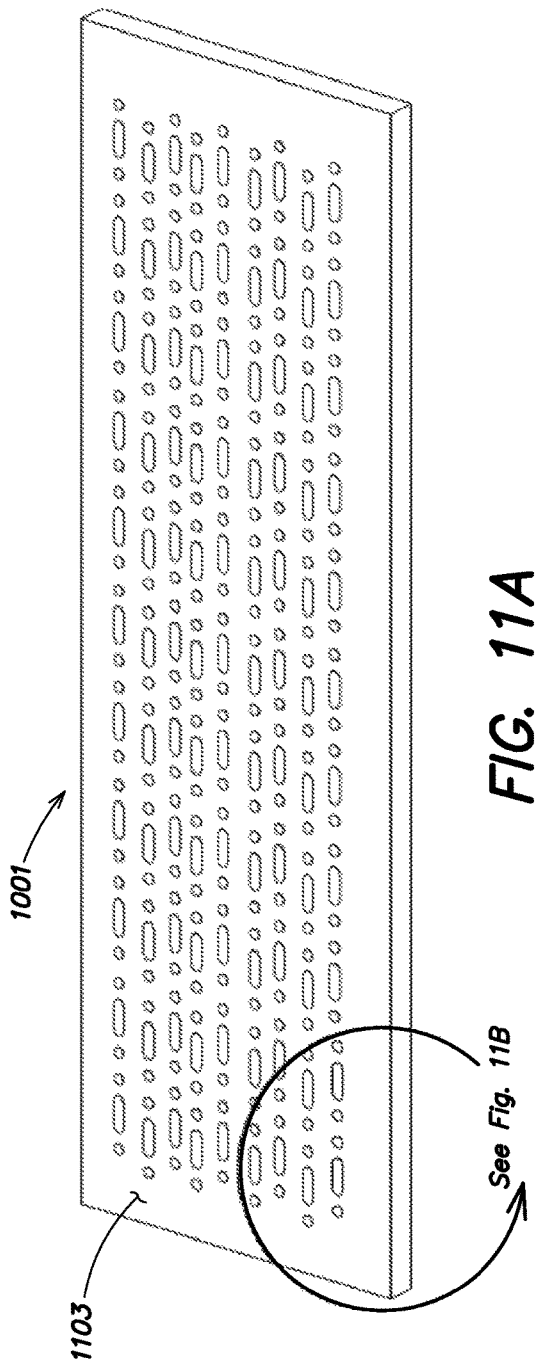
FIG. 11A is a perspective view of a printed circuit board, showing contact pads, according to some embodiments.
Figure 11B:
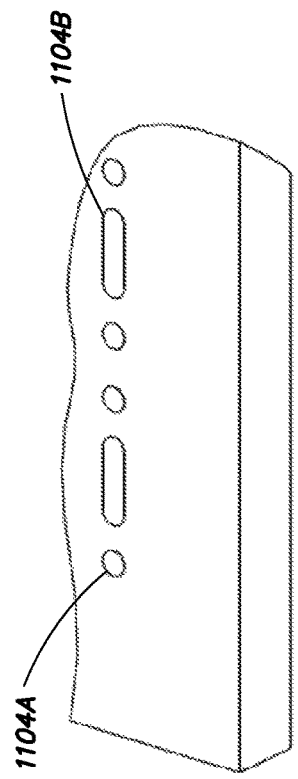
FIG. 11B is an enlarged perspective view of circled region 11B in FIG. 11A.

The method of forming the electronic assembly may comprise 1) inserting a plurality of contacts 704A and 704B into housing 702 such that the mounting ends of the plurality of contacts are disposed in respective pockets in a mounting surface of the housing; 2) applying solder flux to the edges of the contacts; 3) positioning a plurality of solder balls adjacent the edges of the contacts; 4) heating the plurality of solder balls such that solder melts to form solder masses that attach to the mounting ends of the plurality of contacts; 5) positioning the solder masses to face and align with contact pads on surface 703 of PCB 701; and 6) heating the solder masses such that solder melts to form solder masses 708A and 708B that attach to the contact pads such that conduction paths are formed from signal contacts 704A through solder masses 708A to contact pads connecting to signal traces in the PCB, and from reference contacts 704B through solder masses 708B to contact pads connecting to reference planes in the PCB. FIGS. 11A-B illustrate a perspective view of a printed circuit board showing contact pads on a surface of the PCB.

Figure 8A:
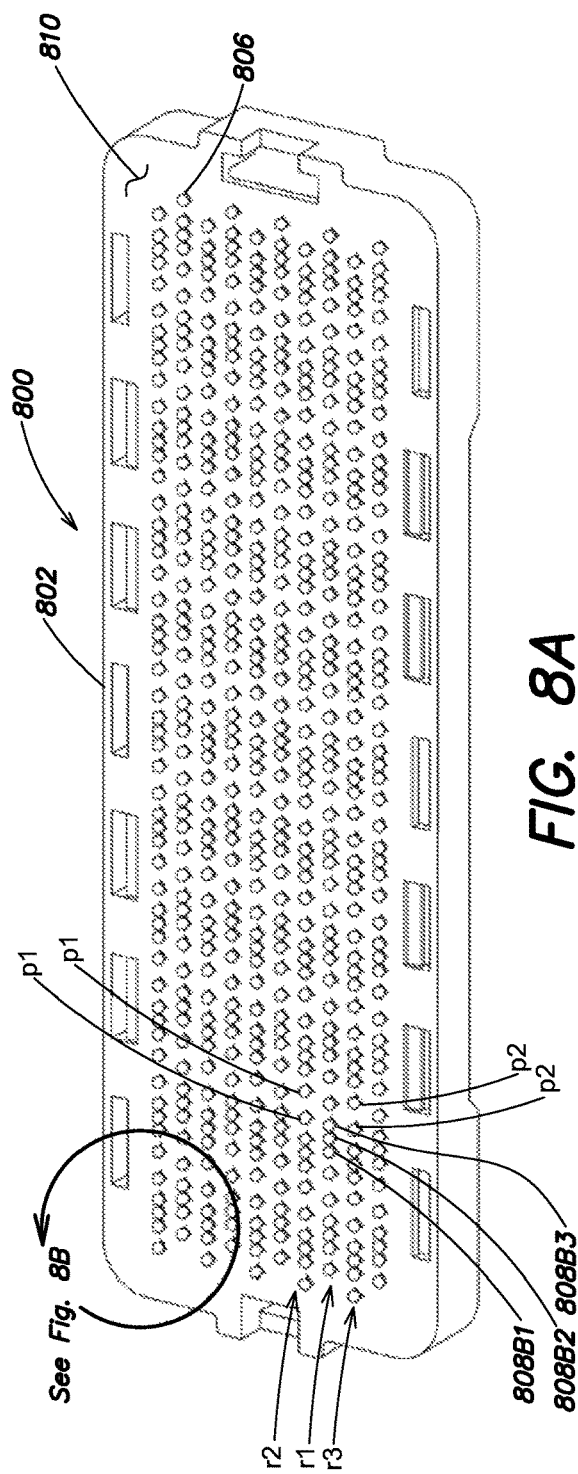
FIG. 8A is a perspective view of an electrical connector, showing the mounting interface before attachment to a printed circuit board, according to some embodiments.
Figure 8B:
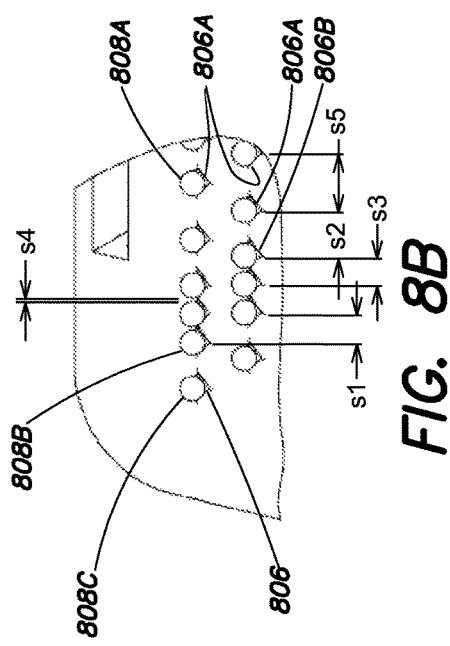
FIG. 8B is an enlarged perspective view of circled region 8B in FIG. 8A.
Figure 8C:
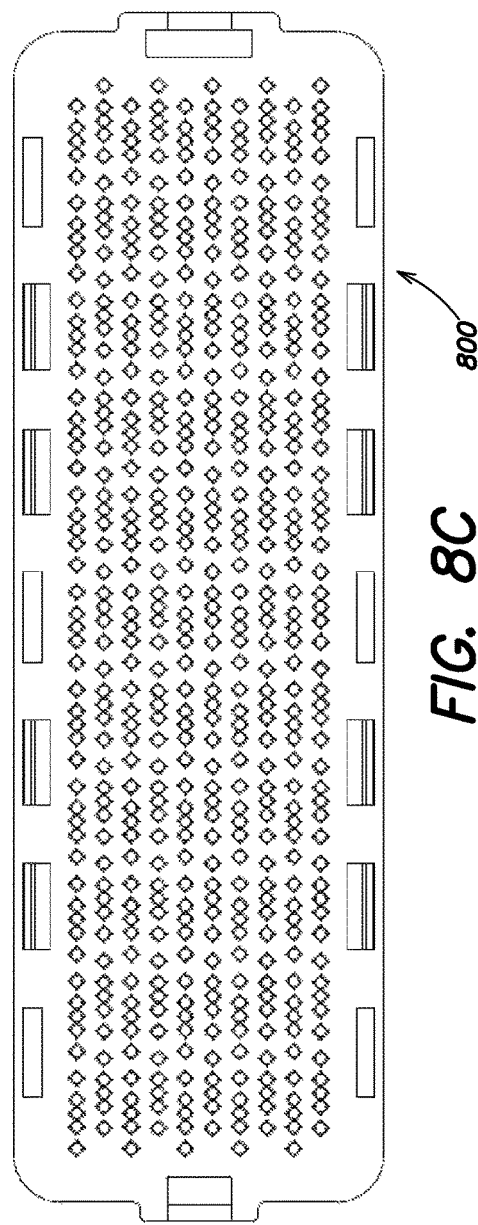
FIG. 8C is a plan view of the electrical connector in FIG. 8A.

FIGS. 8A-8C show a perspective view of electrical connector 800, including a connector housing 802, an array of electrical contacts (not shown) held by the housing, solder masses 808A-C attached to mounting ends of respective contacts, a mating interface (not shown), and a mounting surface 810. In some embodiments, connector 800 may include contacts as pictured in FIGS. 7A-B or contact sets shown in at least one of FIGS. 3A-3C, FIGS. 4A-4C, FIGS. 5A-5D, and FIGS. 6A-6D.

Connector housing 802 may have an array of pockets 806 that are in the mounting surface 810. Each pocket may be sized and positioned to expose a mounting end of an electrical contact and to at least partially receive the mounting end of the contact and a respective solder mass attached to the mounting end of the electrical contact. The array of pockets 806 may be arranged in at least two rows that extend along a row direction. In the illustrated embodiments, the electrical contacts are arranged into 10 rows with 33 contacts per row, some of which are configured as signal contacts and some of which are configured as ground contacts. In the illustrated embodiment, within each row, the contacts are arranged with pairs of signal contacts with an attached solder mass 808A between adjacent ground contacts with an attached solder masses 808B. The ends of each row may have a single ground contact with an attached solder mass 808C. The pairs of signal contacts may be configured to carry high speed differential signals. The single ground contacts at the end of the row may be used for any suitable purpose, such as for low speed control signals. However, the pockets can be configured into any number of rows and columns.

The pockets may be offset relative to corresponding pockets in adjacent rows along the row direction by a distance s1. In some embodiments, s1 may be in the range of 0.5 mm to 1.5 mm, such as 1.2 mm, or any other value within the range. This offset positions the mounting ends of the reference contacts 808B1-808B3 in a first row r1 such that they can provide shielding between the mounting ends of the pairs of signal conductors p1 and p2 in rows r2 and r3 on either side of the first row. By having the mounting ends of the reference contacts close together, the effectiveness of that shielding is enhanced. In some embodiments, the solder balls of the reference contacts are so closely spaced that they are fused into a unitary solder mass to provide more effective shielding, for example, 508B in FIG. 5C or 608B in FIG. 6C. However, in the embodiment illustrated, the spacing is illustrated as s4 in FIG. 8B. The inventors have surprisingly found that, despite a relatively small separating between connector 800 and a substrate to which it is mounted, this positioning of solder balls on reference contacts materially improves performance of the connector.

In some embodiments, pockets 806A may receive signal contacts 224A and pockets 806B may receive reference contacts 224B. The centers of pockets 806A may be isolated from the centers of adjacent pockets 806A by a distance s5 and from the centers of adjacent pockets 806B by a distance s2; the centers of pockets 806B may be isolated from the centers of adjacent pockets 806B by a distance s3. In some embodiments, s2 may be in the range of 0.5 mm to 1.5 mm, preferably 1.15 mm, or any value within the range; s3 may be in the range of 0.5 mm to 1.5 mm, preferably 1.12 mm, or any value within the range; and s5 may be in the range of 0.5 mm to 2 mm, preferably 1.2 mm, or any value within the range.

The pockets in a row may be arranged as a repeating pattern of sets of pockets 806A, 806B corresponding to the sets of electrical contacts they receive. In the illustrated embodiment, a set of pockets include two pockets 806A separated by three pockets 806B aligned in the row direction. When the solder balls are heated above their melting temperature, such as occurs when the colder balls are fused to the mounting ends of the contacts, the solder balls held by 806A may remain disconnected to adjacent solder balls while the solder balls held by pockets 806B may combine with adjacent solder balls held by pockets 806B and form an elongated solder mass or shield such as 708B. However, the number of pockets 806B can be placed together is not limited to three, for example, two or four pockets 806B may be placed together continuously.

The inventors have recognized and appreciated that geometry of the pockets assist in holding the solder masses within desired regions. In the illustrated example of FIG. 8C, the pockets are diamond-shaped, diagonals of which are aligned with the row direction. Though the solder masses may extend from the pockets in a direction perpendicular to the mounting surface, in the row direction, the solder masses are substantially within the perimeters of the pockets. However, the pockets may have different shapes, such as rhombus, oval, circular, square, rectangular, etc. In the illustrated embodiment, all the pockets have equal shape and size, but other embodiments are possible.

Figure 9A:
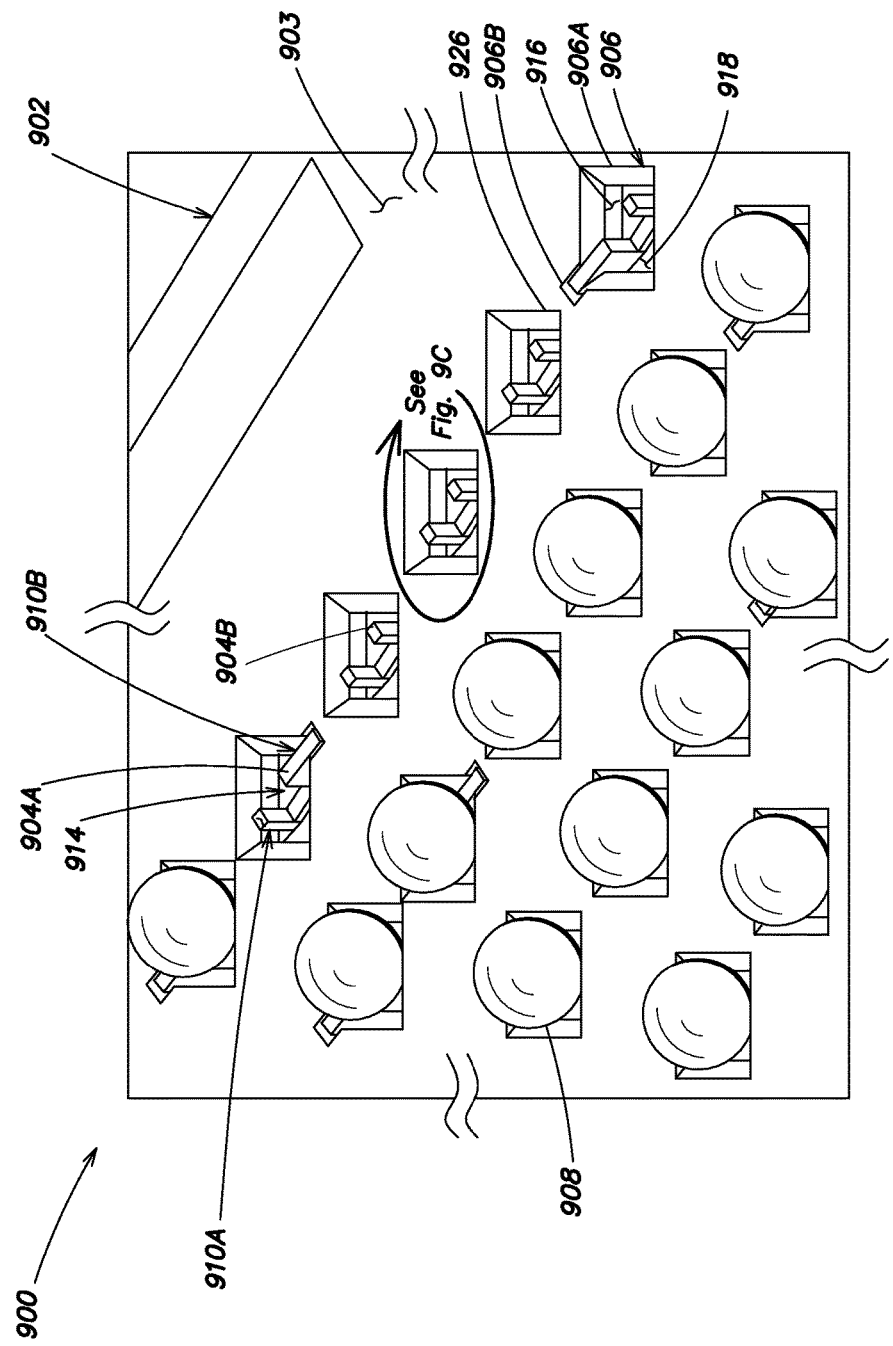
FIG. 9A is a partial perspective view of an electrical connector, showing the mounting surface, according to some embodiments.
Figure 9B:
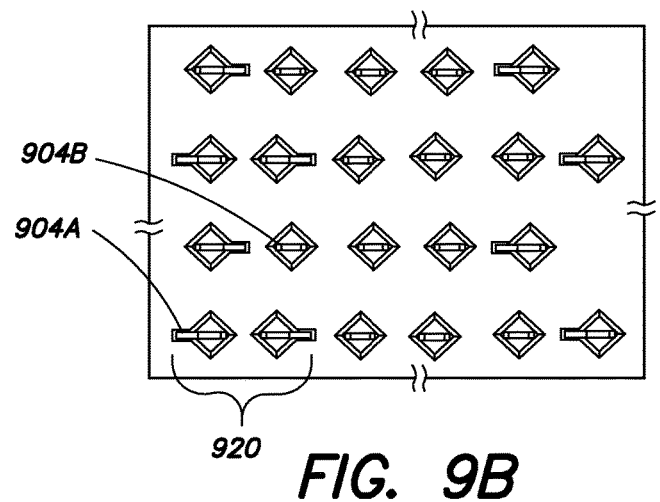
FIG. 9B is a partial plan view of the electrical connector in FIG. 9A.
Figure 9C:
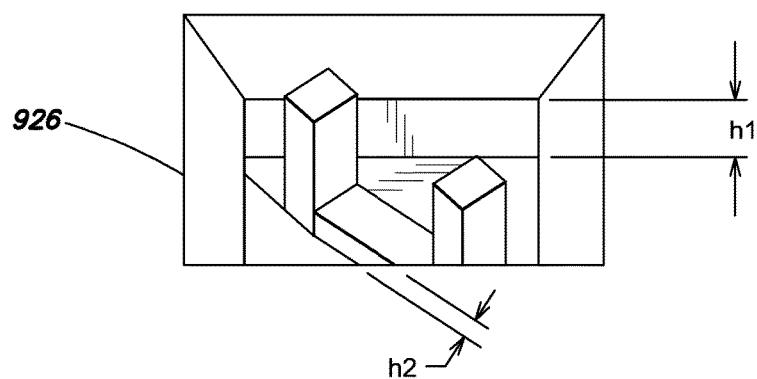
FIG. 9C is an enlarged perspective view of circled region 9C in FIG. 9A.

FIGS. 9A-9C show a partial perspective view of an electrical connector 900. The connector may include a connector housing 902 having a surface 903, a plurality of electrical contacts 904A, 904B held by the housing, and a plurality of solder balls 908 attached to mounting ends of the contacts. Connector housing 902 may include an array of pockets 906 and 926 in the surface 903. The connector is configured for attachment to a circuit assembly with the surface 903 facing the circuit assembly.

Each of the pockets 926 may include a floor 918 surrounded by a wall 916 having a first height h1 in a direction perpendicular to the surface 903. Each of the pockets 906 may further include a first region 906A and a second region/slot 906B that extends from the first region 906A towards an adjacent pocket 926. The first region 906A of a pocket 906 may be configured similarly to a pocket 926. In the illustrated example, the first regions 906a and pockets 926 are diamond-shaped having diagonals aligned with the row direction. However, they can have different shapes, such as rhombus, oval, circular, square, rectangular, etc.

Each pocket may be sized and positioned to at least partially receive a mounting end of an electrical contact 904A or 904B. Solder balls 908 may extend into respective pockets and fused to mounting ends within the pockets. The mounting end of the electrical contact may include a space 914 separating first and second projections 910A and 910B along a direction parallel to the surface 903. The space is disposed above the floor 918 of the pocket at a second distance h2 in the direction perpendicular to the surface 903. In some embodiments, the second height may be less than the first height. In some embodiments, at least one of the first and second projections extends, in a direction perpendicular to the mounting surface of the connector housing, beyond the wall of the respective pocket. For example, in the illustrated embodiment, projection 910B is wider than projection 910A and extends beyond the wall 916 of the pocket in the direction parallel to the surface 903.

In some embodiments, pockets 906 may be designated to receive contacts 904A which may conduct signals and may be arranged as differential pairs 920. Pockets 926 may be designated to receive contact 904B that may conducts reference potentials and are positioned between adjacent signal pairs. A projection of contacts 904A may extend beyond the wall of the respective pocket and towards an adjacent projection of a contact 904B within the same row.

FIGS. 10A-10B illustrate a perspective view of an electrical connector 1000, showing solder masses 1004A, 1004B received by pockets 1006A, 1006B in the mounting surface 1010 of connector housing 1002, according to some embodiments. The difference between FIGS. 10A-B and FIGS. 8A-C is that solder balls received by pockets 1006B fuse with solder balls in adjacent pockets 1006B and form elongated solder masses 1004B when heating solder balls such that solder melts to form solder masses attached to the mounting ends of the contacts.

Each solder mass 1004A or 1004B may have a height perpendicular to the mounting surface 1010, a width, and a length in a row direction which may be a multiple of the width. The length of a solder mass 1004A may be less than the length of a solder mass 1004B. The mass of individual solder mass 1004A may equal the mass of an individual solder ball. Individual solder mass 1004A may be received by a pocket 1006A. The mass of individual solder mass 1004B may equal a combined mass of at least two solder balls. Solder mass 1004B may be received by at least two pockets 1006B. In the illustrated embodiment, the mass of solder mass 1004B equal to a combined mass of three solder balls. And individual solder mass 1004B is received by three pockets 1006B. In some embodiments, solder masses 1004A may be attached to signal contacts, and solder masses 1004B may be attached to reference contacts.

Pockets 1006A, 1006B may be arranged in a plurality of rows. Within each row, pockets 1006A may have a center-to-center spacing in the row direction from adjacent pockets of a first distance, and pockets 1006B may have a center-to-center spacing in the row direction from at least one adjacent pocket 1006B of a second distance. The second distance may be less than the first distance. In some embodiments, pockets 1006A may hold signal contacts and pockets 1006B may hold reference contacts.

FIGS. 11A-11B illustrate a perspective view of a printed circuit board (PCB) 1001. PCB 1001 may have surface pads for surface mounting of a connector according to some embodiments as described herein. The PCB may be formed as a multi-layer assembly manufactured from stacks of dielectric sheets. Some or all of the dielectric sheets may have a conductive film on one or both surfaces. Some of the conductive films may be patterned, using lithographic or laser printing techniques, to form conductive traces that are used to make interconnections between circuit boards, circuits and/or circuit elements. Others of the conductive films may be left substantially intact and may act as ground planes or power planes that supply the reference potentials. The dielectric sheets may be formed into an integral board structure such as by pressing the stacked dielectric sheets together under pressure.

The PCB may include contact pads 1104A and 1104B on a surface 1103. Each contact pad may be sized and positioned corresponding to a solder mass of a connector to be mounted to the PCB. The contact pads may be arranged in rows. Within each row, the contact pads may be arranged in a repeating signal-signal-ground pattern, a ground-signal-signal pattern, or a signal-ground-signal pattern. The contact pads may also be arranged in a repeating signal-signal-ground-ground pattern, a ground-signal-signal-ground pattern, or a signal-ground-signal-ground pattern. In some embodiments, contact pads 1104A may connect to signal traces and contact pads 1104B may connect to reference planes. Contact pads 1104B may be wider than contact pads 1104A. The contact pads within each row may be offset relative to corresponding contact pads in adjacent rows such that contact pads 1104B in each row are offset, in the row direction, towards contact pads 1104A in an adjacent row.

FIG. 12A is an enlarged perspective view of circled region 12A in FIG. 3A reversed 180 degrees, showing a mounting end 1200 of an electrical contact. In the illustrated embodiments, the mounting ends may be shaped to facilitate a manufacturing process that provides improved electrical performance of the connector in one or more ways, including reducing impedance discontinuities at the mounting interface or reducing manufacturing defects from mis-positioned solder balls. Such results may be achieved with a mounting end with an edge profile that supports a solder-flux transfer process, avoiding the variability and impedance-lowering effect of a process using solder paste in the pockets. The profile may be created to provide a relatively large edge length relative to the width of the contact. Positioning of the solder ball may be achieved by having a central portion of that profile lower than the lateral portions, such that the solder ball is positioned by the lowered portion. In the illustrated examples, that lowered portion may be created by a space between projections at the sides of the mounting end.

In the illustrated embodiment, the mounting end 1200 includes a space 1214 separating projections 1210A and 1210B. Edge 1202 of the mounting end of the contact may be joined by surfaces 1204. In the embodiment of FIG. 12A, the projections at the lateral portions of the mounting end are generally rectangular, as is the space between them. Nonetheless, upon reflow, a solder ball placed between the projections 1210A and 1210B may adhere to the edge of the mounting end, centered between 1210A and 1210B.

In the embodiment of FIG. 12A, the projections are set back from the lateral-most portion of the mounting end. In an alternative embodiment, there may be no setback. FIG. 12B is cross-sectional views of circled region 12B in FIG. 12A, illustrating non-limiting alternative profiles of 1206. The mounting end may include a width W1 in a direction parallel to a mounting surface of a connector described herein. Edge 1202 may span the width W1 but have a length L1 along the edge. L1 may be longer than W1 due to the profile of the edge. Edge 1202 may be coated with a solder wettable layer. Surfaces 1204 may have non-solder wettable coating. As a result, a solder ball to be mounted to the mounting end may be shaped by and preferentially adhere to the mounting end.

Figure 12C:
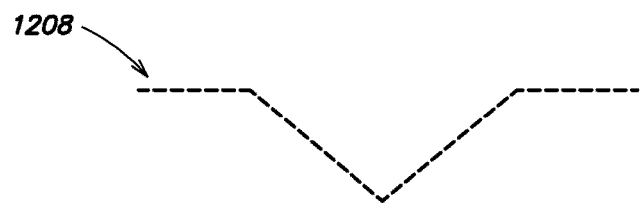
Figure 12D:
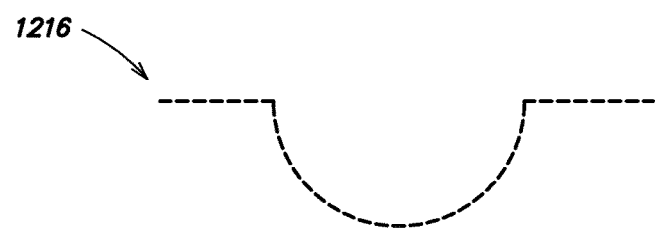
Figure 12E:
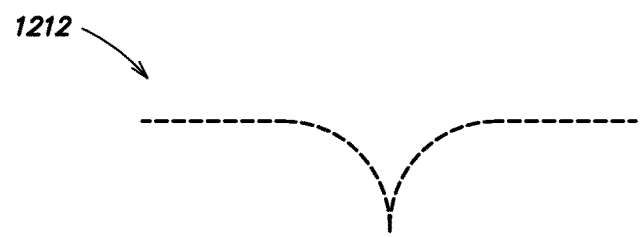

FIGS. 12C-12E illustrate alternative edge profiles 1208, 1212 and 1216 of edge 1202. As can be seen, the edge profile may be triangular, semi-circular, or may have other suitable shapes that increase the length of the exposed edge. These profiles may be symmetrical, but need not be.

FIGS. 13A-13C are illustrate a method of manufacturing a connector described herein, according to some embodiments. One electrical contact 1316 of an array of contacts of the connector is illustrated. Dashed line 1322 illustrates an exemplary geometry of a pocket in a mounting surface of the connector, in which mounting end 1320 of the contact may be disposed. The method may include:

Step 1302: applying solder flux 1308 to the edges 1314 of contact 1316 using pin transfer 1310;

Step 1304: positioning solder ball 1312 adjacent the edges of the contact; and

Step 1306: heating the plurality of solder balls such that solder melts to form solder mass 1318 that attach to the mounting end 1320 of the contact.

As can be seen in FIG. 13C, once the solder ball has reflowed, it is preferentially adhered to locations where solder flux was applied, which in this example leads to the solder mass being preferentially adhered to an edge of the contact. In the embodiment illustrated, the solder ball may be centered within the space between projections defining the mounting end of the contact.

Of significance, because solder paste is not required to attach the solder ball, the mass of fusible material in the pocket may be reduced, reducing the capacitance, and therefore increasing the impedance at the mounting interface of the connector. Such a configuration may reduce impedance discontinuities in the signal paths, which may provide improvements in connector performance. Additionally, as the volume of solder paste is harder to control than the volume of a solder ball, direct attachment of a solder ball to an edge, without use of solder paste, for example, leads to more uniformity from contact to contact or connector to connector. Such uniformity can improve electrical performance of the connection system. Uniformity may also promote co-planarity of the solder masses, which may improve mechanical robustness of the connections to a printed circuit board when a connector is mounted to the printed circuit board.

Although details of specific configurations of electrical contacts and housings are described above, it should be appreciated that such details are provided solely for purposes of illustration, as the concepts disclosed herein are capable of other manners of implementation. In that respect, various connector designs described herein may be used in any suitable combination, as aspects of the present disclosure are not limited to the particular combinations shown in the drawings.

Having thus described several embodiments, it is to be appreciated various alterations, modifications, and improvements may readily occur to those skilled in the art. Such alterations, modifications, and improvements are intended to be within the spirit and scope of the invention. Accordingly, the foregoing description and drawings are by way of example only.

High speed connectors are described herein. The speed of a connector may be determined using known measurement techniques by which the highest operating frequency at which a connector exhibits an electrical characteristic within a desired limit. The frequency range of interest may depend on the operating parameters of the system in which such a connector is used, but may generally have an upper limit between about 15 GHz and 60 GHz, such as 25 GHz, 30

GHz or 40 GHz, although higher frequencies or lower frequencies may be of interest in some applications. Some connector designs may have frequency ranges of interest that span only a portion of this range, such as 1 to 10 GHz or 3 to 15 GHz or 5 to 35 GHz.

The operating frequency range for an interconnection system may be determined based on the range of frequencies that can pass through the interconnection with acceptable signal integrity. Signal integrity may be measured in terms of a number of criteria that depend on the application for which an interconnection system is designed. Some of these criteria may relate to the propagation of the signal along a single-ended signal path, a differential signal path, a hollow waveguide, or any other type of signal path. Two examples of such criteria are the attenuation of a signal along a signal path or the reflection of a signal from a signal path.

Other criteria may relate to interaction of multiple distinct signal paths. Such criteria may include, for example, near end cross talk, defined as the portion of a signal injected on one signal path at one end of the interconnection system that is measurable at any other signal path on the same end of the interconnection system. Another such criterion may be far end cross talk, defined as the portion of a signal injected on one signal path at one end of the interconnection system that is measurable at any other signal path on the other end of the interconnection system.

As specific examples, it could be required that signal path attenuation be no more than 3 dB power loss, reflected power ratio be no greater than −20 dB, and individual signal path to signal path crosstalk contributions be no greater than −50 dB. Because these characteristics are frequency dependent, the operating range of an interconnection system is defined as the range of frequencies over which the specified criteria are met.

Designs of an electrical connector are described herein that improve signal integrity for high frequency signals, such as at frequencies in the GHz range, including up to about 25 GHz or up to about 40 GHz, up to about 50 GHz or up to about 60 GHz or up to about 75 GHz or higher, while maintaining high density, such as with a spacing between adjacent mating contacts on the order of 3 mm or less, including center-to-center spacing between adjacent contacts in a column of between 1 mm and 2.5 mm or between 2 mm and 2.5 mm, for example. Spacing between columns of mating contact portions may be similar, although there is no requirement that the spacing between all mating contacts in a connector be the same. It should be appreciated, however, that connectors as described herein might be configured to meet other requirements.

Furthermore, although many inventive aspects are shown and described with reference to a connector having a mezzanine configuration, it should be appreciated that aspects of the present disclosure is not limited in this regard, as any of the inventive concepts, whether alone or in combination with one or more other inventive concepts, may be used in other types of electrical connectors, such as right angle connectors, cable connectors, stacking connectors, I/O connectors, chip sockets, etc.

The present disclosure is not limited to the details of construction or the arrangements of components set forth in the foregoing description and/or the drawings. Various embodiments are provided solely for purposes of illustration, and the concepts described herein are capable of being practiced or carried out in other ways. Also, the phraseology and terminology used herein are for the purpose of description and should not be regarded as limiting. The use of "including," "comprising," "having," "containing," or "involving," and variations thereof herein, is meant to encompass the items listed thereafter (or equivalents thereof) and/or as additional items.

Moreover, it should be appreciated that certain dimensions, said to be "equal" need not be precisely the same. Manufacturing tolerances and the precision of the system being constructed impact what one of skill in the art would consider to be "equal." However, differences within +/−10% generally will be regarded as equal.

What is claimed is:

1. A connector having a housing with a surface, wherein the connector is configured for attachment to a circuit board with the surface facing the circuit board, the connector comprising:
   a plurality of pockets in the surface; and
   a plurality of contacts held by the housing, each of the plurality of contacts comprising a mating end, a mounting end opposite the mating end and disposed within at least a respective one of the plurality of pockets, and an intermediate portion that extends between the mating end and the mounting end;
   wherein:
   the plurality of pockets are arranged in a plurality of rows;
   within each row, a first portion of the pockets have a center-to-center spacing in a row direction of a first distance from at least one adjacent pocket of the first portion of the pockets, and a second portion of the pockets have a center-to-center spacing in the row direction of a second distance from at least one adjacent pocket of the second portion of the pockets; and
   the second distance is less than the first distance.

2. The connector as recited in claim 1, wherein the plurality of pockets comprise a rhombus region having a diagonal aligned with the row direction.

3. The connector as recited in claim 1, wherein the pockets of the first portion comprise a first region and a second region, the second region comprising a slot that extends from the first region towards an adjacent pocket in the second portion.

4. The connector as recited in claim 3, wherein the first region is rhombus.

5. The connector in claim 1, further comprising:
   a plurality of solder balls extending into respective pockets of the plurality of pockets and fused to mounting ends within the pockets.

6. The connector of claim 1, wherein:
   the connector further comprises a plurality of solder masses fused to mounting ends within the pockets; and
   each of the solder masses fused to the mounting ends in the pockets of the second portion is fused to a solder mass fused to a mounting end in the at least one adjacent pocket of the second portion.

7. The connector of claim 6, further comprising:
   a plurality of solder balls fused to respective mounting ends in the pockets of the first portion.

8. The connector of claim 1, wherein:
   the pockets of the plurality of pockets within each row are offset relative to corresponding pockets in adjacent rows such that the pockets of the second portion in each row are offset, in the row direction, toward pockets of the first portion in an adjacent row.

9. The connector of claim 1, wherein, in each row of the plurality of rows, the pockets are arranged with pairs of pockets of the first portion, with each pair separated from an adjacent pair, by a plurality of pockets of the second portion.

10. The connector as recited in claim 9, wherein each pair of the first portion is separated from an adjacent pair by two pockets of the second portion.

11. The connector as recited in claim 9, wherein each pair of the first portion is separated from an adjacent pair by three pockets of the second portion.

12. The connector as recited in claim 1, wherein:
the plurality of rows comprise rows of a first row type and a second row type;
rows of the first row type and the second row type are arranged alternatively; and
rows of the second row type offset in the row direction from rows of the first row type by a third distance.

13. An electrical assembly comprising:
a printed circuit board comprising a surface with a plurality of contact pads disposed thereon;
a connector comprising a plurality of contacts; and
a plurality of solder masses comprising a first type and a second type disposed in a plurality of parallel rows extending in a row direction, each of the plurality of solder masses having a height perpendicular to the surface of the printed circuit board, a width, and a length in the row direction, the length being a multiple of the width, each of the plurality of solder masses being attached to a single contact of the plurality of contacts,
wherein:
the length of a first type of the plurality of solder masses is less than the length of a second type, and each of the plurality of solder masses is fused to a contact pad of the printed circuit board and a contact of the connector.

14. The electrical assembly as recited in claim 13, wherein each of the second type of the plurality of solder masses equal to a combined mass of a plurality of first type solder masses.

15. The electrical assembly as recited in claim 13, wherein the connector further comprises a housing with a surface, wherein the connector is configured for attachment to the printed circuit board with the surface of the housing facing the printed circuit board.

16. The electrical assembly as recited in claim 15, wherein the housing comprises a plurality of pockets in the surface, wherein:
the plurality of pockets are arranged in a plurality of rows;
within each row, a first portion of the pockets have a center-to-center spacing in a row direction from adjacent pockets of a first distance, and a second portion of the pockets have a center-to-center spacing from at least one adjacent pocket of a second distance; and
the second distance is less than the first distance.

17. The electrical assembly as recited in claim 15, wherein:
each of the plurality of contacts of the connector comprises a mating end, a mounting end opposite the mating end, and an intermediate portion that extends between the mating and the mounting end;
the mounting ends extend from the housing adjacent the surface of the housing; and
the mounting end of each of the plurality of contacts comprises first and second projections separated by a space.

18. The electrical assembly as recited in claim 17, wherein:
the plurality of contacts comprise a first type and a second type;

the second projection of each first type contact is wider than the first projection of each first type contact;
each of the second type contacts is wider than each of the first type contacts along the first direction; and
the mounting end of each second type contact comprises at least four projections.

19. The electrical assembly as recited in claim 18, wherein:
the housing comprises a plurality of pockets in the surface, the pockets comprising a plurality of first type pockets and a plurality of second type pockets;
each first type pocket receives a mounting end of a first type contact and a first type solder mass;
each second type pocket receives a portion of a mounting end of a second type contact and a portion of a second type solder mass; and
a center-to-center space between a first type pocket and an adjacent pocket of the plurality of pockets is greater than the center-to-center spacing between a second type pocket and an adjacent second type pocket of the plurality of pockets.

20. The electrical assembly of claim 13, wherein:
the printed circuit board comprises signal traces and reference planes connected to contact pads of the plurality of contact pads;
solder masses of the first type are fused to contact pads connected to signal traces; and
solder masses of the second type are fused to contact pads connected to reference planes.

21. The electrical assembly as recited in claim 16, wherein:
The pockets of the plurality of pockets within each row are offset relative to corresponding pockets in adjacent rows such that the pockets of the second portion in each row are offset, in the row direction, toward pockets of the first portion in an adjacent row.

22. A method of manufacturing a connector comprising a plurality of contacts, each comprising a mating end, a mounting end opposite the mating end, and an intermediate portion that extends between the mating end and the mounting end, the method comprising:
forming a housing comprising a plurality of pockets to hold the plurality of contacts at a surface, wherein:
the plurality of pockets are arranged in a plurality of rows; and
within each row, a first portion of the pockets have a center-to-center spacing in a row direction from adjacent pockets of a first distance, a second portion of the pockets have a center-to-center spacing at the row direction from at least one adjacent pocket of a second distance, and the second distance is less than the first distance;
inserting the mounting end of a contact of the plurality of contacts through at least two pockets of the second portion of the pockets;
positioning a plurality of solder balls within the plurality of pockets; and
heating the plurality of solder balls such that solder melts to form a plurality of solder masses attached to the mounting ends of the plurality of contacts.

23. The method of forming an electrical assembly with a connector manufactured according to the method of claim 22, the method of forming the electrical assembly further comprising:
positioning the solder masses of the connector to face and align with a plurality of contact pads of a printed circuit board; and heating the solder masses such that solder melts to attach to the plurality of contact pads of the printed circuit board.

24. The method of claim 23, wherein heating solder masses such that solder melts to attach to the plurality of contact pads of the printed circuit board comprises fusing solder masses within the second portion of the plurality of pockets to solder masses in at least one adjacent pocket of the second portion.

25. The method of claim 22, wherein heating solder balls such that solder melts to form a plurality of solder masses attached to mounting ends of a plurality of contacts comprises fusing solder balls within the second portion of the plurality of pockets to solder balls in at least one adjacent pocket of the second portion.

* * * * *